US009001959B2

(12) United States Patent
Koyama

(10) Patent No.: US 9,001,959 B2
(45) Date of Patent: Apr. 7, 2015

(54) SEMICONDUCTOR DEVICE

(75) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/592,755

(22) Filed: Aug. 23, 2012

(65) Prior Publication Data

US 2013/0049133 A1 Feb. 28, 2013

(30) Foreign Application Priority Data

Aug. 29, 2011 (JP) ................................. 2011-185614

(51) Int. Cl.
G11C 19/00 (2006.01)
H01L 27/12 (2006.01)

(52) U.S. Cl.
CPC .... H01L 27/1225 (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 5,701,136 A * | 12/1997 | Huq et al. | 345/100 |
| 5,731,856 A | 3/1998 | Kim et al. | |
| 5,744,864 A | 4/1998 | Cillessen et al. | |
| 5,859,630 A * | 1/1999 | Huq | 345/100 |
| 5,949,398 A * | 9/1999 | Kim | 345/100 |
| 6,121,797 A | 9/2000 | Song | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,116,748 B2 * | 10/2006 | Nagao et al. | 377/79 |
| 7,211,825 B2 | 5/2007 | Shih et al | |

(Continued)

FOREIGN PATENT DOCUMENTS

| EP | 1 737 044 A1 | 12/2006 |
|---|---|---|
| EP | 1 895 545 A2 | 3/2008 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Tuan T Lam
(74) *Attorney, Agent, or Firm* — Fish & Richardson P.C.

(57) ABSTRACT

A semiconductor device that includes transistors having the same polarity consumes less power and can prevent a decrease in amplitude of a potential output. The semiconductor device includes a first wiring having a first potential, a second wiring having a second potential, a third wiring having a third potential, a first transistor and a second transistor having the same polarity, and a plurality of third transistors for selecting supply of the first potential to gates of the first transistor and the second transistor or supply of the third potential to the gates of the first transistor and the second transistor and for selecting whether to supply one potential to drain terminals of the first transistor and the second transistor. A source terminal of the first transistor is connected to the second wiring, and a source terminal of the second transistor is connected to the third wiring.

27 Claims, 15 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,352,839 B2* | 4/2008 | Yu | 377/64 |
| 7,369,111 B2* | 5/2008 | Jeon et al. | 345/100 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,796,109 B2 | 9/2010 | Mamba | |
| 7,859,510 B2 | 12/2010 | Umezaki | |
| 7,907,113 B2* | 3/2011 | Jang et al. | 345/100 |
| 7,932,888 B2 | 4/2011 | Miyake | |
| 7,978,274 B2 | 7/2011 | Umezaki et al. | |
| 7,983,379 B2* | 7/2011 | Ieong et al. | 377/64 |
| 8,054,279 B2 | 11/2011 | Umezaki et al. | |
| 8,085,235 B2* | 12/2011 | Jeon et al. | 345/100 |
| 8,089,445 B2* | 1/2012 | Shin et al. | 345/92 |
| 8,107,586 B2* | 1/2012 | Shin et al. | 377/64 |
| 8,109,039 B2* | 2/2012 | Kruger et al. | 49/349 |
| 8,175,215 B2* | 5/2012 | Liu et al. | 377/64 |
| 8,456,396 B2 | 6/2013 | Umezaki | |
| 8,462,100 B2 | 6/2013 | Umezaki | |
| 8,582,715 B2* | 11/2013 | Chung et al. | 377/74 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0086558 A1* | 4/2007 | Wei et al. | 377/64 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0193622 A1 | 8/2011 | Miyake | |
| 2011/0255652 A1* | 10/2011 | Yang et al. | 377/64 |
| 2011/0260169 A1 | 10/2011 | Umezaki et al. | |
| 2011/0285675 A1* | 11/2011 | Amano et al. | 345/204 |
| 2012/0049184 A1 | 3/2012 | Umezaki et al. | |
| 2012/0056860 A1 | 3/2012 | Umezaki et al. | |
| 2012/0163528 A1* | 6/2012 | Jang et al. | 377/64 |
| 2013/0010916 A1* | 1/2013 | Jang et al. | 377/64 |
| 2013/0322592 A1* | 12/2013 | Miyake et al. | 377/64 |
| 2014/0044228 A1* | 2/2014 | Jang | 377/64 |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-503591 A | 3/1999 |
| JP | 11-505377 A | 5/1999 |
| JP | 2000-044236 A | 2/2000 |
| JP | 2000-150900 A | 5/2000 |
| JP | 2001-325798 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-123865 A | 5/2005 |
| JP | 2007-011278 A | 1/2007 |
| JP | 2008-083692 A | 4/2008 |
| JP | 2010-277652 A | 12/2010 |
| WO | 97/28604 A1 | 8/1997 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, No. 12, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

International Search Report (Application No. PCT/JP2012/071754) dated Oct. 9, 2012, in English.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

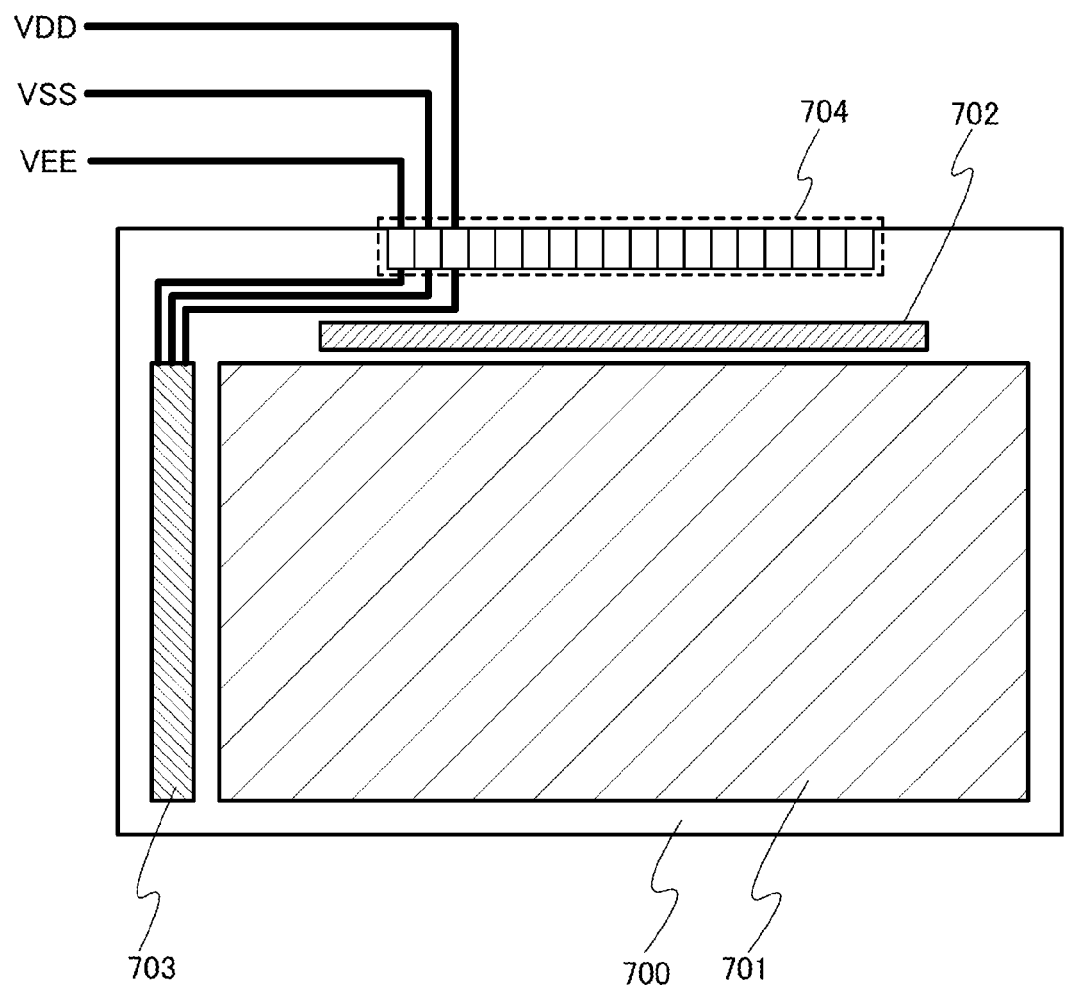

SEMICONDUCTOR DEVICE

TECHNICAL FIELD

The present invention relates to circuits that include transistors having the same polarity, and semiconductor devices such as semiconductor display devices that include the circuits.

BACKGROUND ART

Semiconductor display devices such as liquid crystal display devices and EL display devices preferably include semiconductors having the same polarity rather than complementary metal oxide semiconductors (CMOSs) in order to reduce the cost of backplanes (circuit boards). Patent Documents 1 and 2 disclose techniques for forming a variety of circuits such as inverters and shift registers that are used in driver circuits of semiconductor display devices and are constituted of transistors having the same polarity.

REFERENCES

Patent Document 1: Japanese Published Patent Application No. 2001-325798
Patent Document 2: Japanese Published Patent Application No. 2010-277652

DISCLOSURE OF INVENTION

For a semiconductor display device constituted of an amorphous silicon or oxide semiconductor transistor, a glass substrate of the fifth generation (1200 mm wide×1300 mm long) or later can be used. Thus, such a semiconductor display device has advantages of high productivity and low cost. However, amorphous silicon or oxide semiconductor transistors generally have the same polarity and easily become normally on. In addition, a circuit constituted of transistors having the same polarity has a problem of increased power consumption or smaller amplitude of a potential output when the transistor is normally on.

For example, in a circuit disclosed in FIG. 10 of Patent Document 2, the potential of a source terminal of a transistor Q2 is fixed to a low potential VSS. If the transistor Q2 is normally off, the transistor Q2 is turned off when the low potential VSS is applied to a gate of the transistor Q2. If the transistor Q2 is normally on, even when the low potential VSS is applied to the gate of the transistor Q2, voltage of the gate with respect to the source terminal (gate voltage) is kept higher than the threshold voltage of the transistor Q2. Thus, the transistor Q2 is not turned off but is turned on.

When the transistor Q2 is on though it should be off, wasted current flows to the circuit, so that consumption current is increased. Further, the wasted current increases current flowing to a wiring for supplying a potential (e.g., in the case of FIG. 10 of Patent Document 2, the low-level potential VSS or a high-level potential VDD and the low-level potential VSS of a clock signal CLKA) to the circuit. Then, the resistance of the wiring decreases the potential of the wiring supplied with the potential VDD and increases the potential of the wiring supplied with the potential VSS. Accordingly, the amplitude of a potential output from the circuit is smaller than a difference between the potentials VDD and VSS (an ideal potential difference).

In particular, in a pixel portion of a semiconductor display device, when a potential output from a circuit is supplied to a wiring called a bus line (e.g., a scan line or a signal line) that is connected to a plurality of pixels, a transistor for controlling the output of a potential from the circuit (e.g., the transistor Q2 in FIG. 10 of Patent Document 2) needs high current supply capability. Thus, the channel width W of the transistor is made larger than the channel width W of another transistor in the circuit in many cases. The drain current of the transistor is proportional to the channel width W. Thus, in the case where the channel width W of a normally-on transistor is made larger, the amount of current flowing to the normally-on transistor is larger than that of another transistor when the normally-on transistor should be off. Consequently, wasted current flowing to the circuit is increased, so that the aforementioned increase in power consumption or decrease in amplitude of a potential output remarkably occurs.

Under the technical background, it is an object of the present invention to provide a low-power semiconductor device. Alternatively, it is an object of the present invention to provide a semiconductor device capable of preventing a decrease in amplitude of a potential output.

A semiconductor device according to one embodiment of the present invention is a circuit that includes a plurality of transistors and selectively outputs a high potential or a low potential by turning on or off the plurality of transistors. In one embodiment of the present invention, among the plurality of transistors, a source terminal of an output-side transistor and a source terminal of a different transistor are supplied with potentials through different wirings. Further, the output-side transistor is turned off when a potential from the wiring for supplying a potential to the source terminal of the different transistor is supplied to a gate of the output-side transistor through the different transistor.

The above structure can electrically isolate the gate and the source terminal of the output-side transistor from each other. Thus, even when the output-side transistor is normally on and thus the potential of the wiring for supplying a potential to the source terminal of the output-side transistor is varied, the potential of a wiring for supplying a potential to the gate of the output-side transistor is independent of the variation. Consequently, when the potential of the source terminal of the output-side transistor is varied by the drain current of the output-side transistor, the gate voltage of the output-side transistor can be close to the threshold voltage, that is, negative feedback can be performed. Accordingly, even when the output-side transistor is normally on, the output-side transistor can be turned off when it should be turned off.

In one embodiment of the present invention, it is possible to provide a low-power semiconductor device constituted of transistors having the same polarity. Alternatively, in one embodiment of the present invention, it is possible to provide a semiconductor device capable of preventing a decrease in amplitude of a potential output.

BRIEF DESCRIPTION OF DRAWINGS

In the accompanying drawings.

FIG. 14 illustrates the structure of a panel; and

BEST MODE FOR CARRYING OUT THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the present invention can be used for manufacture of any kind of semiconductor devices, for example, integrated circuits such as microprocessors, image processing circuits, digital signal processors (DSPs), and microcontrollers, RF tags, and semiconductor display devices. The category of semiconductor display devices includes liquid crystal display devices, EL display devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which circuit elements constituted of semiconductor films are included in driver circuits.

Note that in this specification, the category of semiconductor display devices includes panels in which a display element such as a liquid crystal element or a light-emitting element is formed in each pixel, and modules in which ICs and the like including controllers are mounted on the panels.

Embodiment 1

Figure 1A:
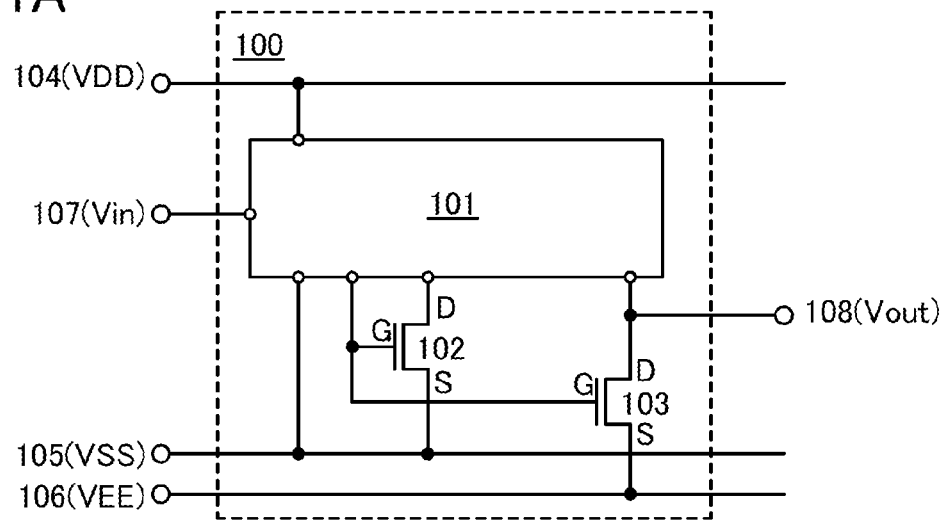
FIGS. 1A and 1B each illustrate the structure of a semiconductor device.

FIG. 1A illustrates a circuit structure example of a semiconductor device according to one embodiment of the present invention. A semiconductor device 100 illustrated in FIG. 1A includes a circuit 101 having a plurality of transistors, a transistor 102, and a transistor 103. In the semiconductor device 100 illustrated in FIG. 1A, at least the transistors 102 and 103 have the same polarity. In FIG. 1A, the transistors 102 and 103 are n-channel transistors.

A high-level potential VDD and a low-level potential VSS are applied to the circuit 101 through a wiring 104 and a wiring 105. In FIG. 1A, the potential VDD is applied to the circuit 101 through the wiring 104, and the potential VSS is applied to the circuit 101 through the wiring 105. Further, a signal potential Vin is applied to the circuit 101 through a wiring 107.

A gate and a drain terminal of the transistor 102 are connected to the circuit 101. The circuit 101 selects the potential VDD or the potential VSS in accordance with the potential Vin and applies the selected potential to the gate or the drain terminal of transistor 102. The potential VSS of the wiring 105 is applied to a source terminal of the transistor 102.

Note that a "source terminal" of a transistor means a source region that is part of an active layer or a source electrode that is connected to an active layer. Similarly, a "drain terminal" of a transistor means a drain region that is part of an active layer or a drain electrode that is connected to an active layer.

A gate and a drain terminal of the transistor 103 are connected to the circuit 101. The circuit 101 selects the potential VDD or the potential VSS in accordance with the potential Vin and applies the selected potential to the gate or the drain terminal of transistor 103. A potential VEE is applied to a source terminal of the transistor 103 through a wiring 106. The potential VEE is a low-level potential that is lower than the potential VDD. In addition, the potential VEE is preferably equal to or higher than the potential VSS.

Note that the terms "source terminal" and "drain terminal" of a transistor interchange with each other depending on the polarity of the transistor or levels of potentials applied to electrodes. In general, in an n-channel transistor, an electrode to which a low potential is applied is called a source terminal, and an electrode to which a high potential is applied is called a drain terminal. Further, in a p-channel transistor, an electrode to which a low potential is applied is called a drain terminal, and an electrode to which a high potential is applied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

In this specification, the term "connection" means electrical connection and corresponds to a state in which current, voltage, or a potential can be supplied or transmitted. Accordingly, a connection state does not always mean a direct connection state but includes an indirect connection state through an element such as a wiring, a conductive film, a resistor, a diode, or a transistor so that current, voltage, or a potential can be supplied or transmitted.

Even when independent components are connected to each other in a circuit diagram, there is the case where one conductive film has functions of a plurality of components, such as the case where part of a wiring functions as an electrode. The term "connection" in this specification also means such a case where one conductive film has functions of a plurality of components.

The potential applied from the circuit 101 to the gate of the transistor 102 is the same as the potential applied from the circuit 101 to the gate of the transistor 103. In FIG. 1A, the gate of the transistor 102 and the gate of the transistor 103 are connected to each other.

The semiconductor device 100 illustrated in FIG. 1A selects the potential VDD or the potential VEE by turning on or off the plurality of transistors in the circuit 101, the transistor 102, and the transistor 103 in accordance with the signal potential Vin, and outputs the selected potential to a wiring 108 as a potential Vout. Specifically, when the wiring 104 and the wiring 108 are connected to each other through the circuit 101, the potential of the wiring 104 is output as the potential Vout. When the wiring 106 and the wiring 108 are connected to each other through the transistor 103, the potential of the wiring 106 is output as the potential Vout.

When the potential Vout output from semiconductor device 100 is supplied to a wiring called a bus line (e.g., a scan line or a signal line) that is connected to a plurality of pixels, the transistor 103 for controlling the output of the potential Vout needs high current supply capability. Thus, the channel width W of the transistor 103 is preferably made larger than the channel width W of the transistor in the circuit 101 or the transistor 102.

Note that in the case where the transistor 102 is an n-channel transistor, the transistor 102 is turned on when the potential VDD is applied from the circuit 101 to the gate of the transistor 102. When the potential VSS is applied from the circuit 101 to the gate of the transistor 102, gate voltage Vgs becomes 0 V. Thus, when the transistor 102 is normally off, that is, threshold voltage Vth is higher than 0 V, the transistor 102 is turned off. When the transistor 102 is normally on, that is, the threshold voltage Vth is 0 V or lower, the transistor 102 is not turned off but is turned on.

The transistor 103 operates in a manner similar to that of the transistor 102. Specifically, in the case where the transistor 103 is an n-channel transistor, the transistor 103 is turned on when the potential VDD is applied from the circuit 101 to the gate of the transistor 103. When the potential VSS is applied from the circuit 101 to the gate of the transistor 103, gate voltage Vgs equals VSS−VEE, that is, becomes 0 V or lower. Thus, when the transistor 103 is normally off, that is, threshold voltage Vth is higher than 0 V, the transistor 103 is turned off. When the transistor 103 is normally on, that is, the threshold voltage Vth is 0 V or lower, the transistor 103 is not turned off but is turned on in some cases.

The operation of the semiconductor device 100 illustrated in FIG. 1A in the case of the normally-on transistors 102 and 103 is described in detail below.

Taking VSS−VEE>Vth, the gate voltage Vgs of the transistor 103 equals VSS−VEE>Vth when the potential VSS is applied to the gate of the transistor 103. Thus, the transistor 103 is turned on. In addition, as described above, when the potential VSS is applied to the gate of the transistor 102, the transistor 102 is turned on regardless of the level of the potential VEE.

In the case where the transistors 102 and 103 are on though they should be off, when the potential VDD is applied from the circuit 101 to the drain terminals of the transistors 102 and 103, current flows to the wiring 105 through the transistor 102, and current flows to the wiring 106 through the transistor 103. Thus, the potential of the wiring 105 is raised from the potential VSS to the potential VSS+Vα. Similarly, the potential of the wiring 106 is raised from the potential VEE to the potential VEE+Vβ.

Note that in the case where the channel width W of the transistor 103 is larger than the channel width W of the transistor 102 as described above, even when the transistor 102 and the transistor 103 have the same gate voltage Vgs, the amount of current flowing to the wiring 106 through the transistor 103 is larger than the amount of current flowing to the wiring 105 through the transistor 102. Thus, in the case where the channel width W of the transistor 103 is larger than the channel width W of the transistor 102, a rise in potential of the wiring 106 is greater than a rise in potential of the wiring 105, and eventually the potential VSS+Vα equals the potential VEE+Vβ+Vth. Consequently, the gate voltage Vgs of the transistor 103 is decreased to the threshold voltage Vth, so that the transistor 103 is almost turned off. Accordingly, even when the transistor 103 is normally on, the transistor 103 can be almost turned off when it should be turned off.

Taking VSS−VEE≤Vth, the gate voltage Vgs equals VSS−VEE≤Vth when the potential VSS is applied to the gate of the transistor 103. Thus, in that case, even when the transistor 103 is normally on, the transistor 103 can be turned off.

Note that when the potential VSS is applied to the gate of the transistor 102, the transistor 102 is turned on regardless of the level of the potential VEE. Thus, the potential of the wiring 105 is raised from the potential VSS to the potential VSS+Vα. Since the potential of the wiring 105 is applied from the circuit 101 to the gate of the transistor 103, due to a rise in potential of the wiring 105, the potential applied to the gate of the transistor 103 is also raised from the potential VSS to the potential VSS+Vα.

Even when the potential applied to the gate of the transistor 103 is raised, the transistor 103 is kept off if the gate voltage Vgs equals VSS+Vα−VEE≤Vth. If the gate voltage Vgs equals VSS+Vα−VEE>Vth, the transistor 103 is turned on. However, in that case, the potential of the wiring 106 is raised when current flows to the wiring 106 through the transistor 103, and eventually the potential VSS+Vα equals the potential VEE+Vγ+Vth. Consequently, the gate voltage Vgs of the transistor 103 is decreased to the threshold voltage Vth, so that the transistor 103 is almost turned off.

In this manner, in the semiconductor device 100 according to one embodiment of the present invention, the source terminal of the output-side transistor 103 and the source terminal of a transistor other than the transistor 103 (e.g., the transistor 102) are supplied with the different wirings 106 and 105, respectively, so that negative feedback can be performed in order that the gate voltage of the transistor 103 is close to the threshold voltage when the drain current of the transistor 103 is high. Accordingly, even when the transistor 103 is normally on, the transistor 103 can be turned off. Consequently, even when the resistance of each wiring decreases the potential of the wiring 104 and increases the potential of the wiring 105, the power consumption of the semiconductor device 100 can be reduced. Further, a decrease in amplitude of the potential Vout output from the semiconductor device 100 can be prevented.

Note that although the transistors 102 and 103 are n-channel transistors in FIG. 1A, the transistors 102 and 103 may be p-channel transistors. In such a case, a potential that is higher than the potential of the wiring 104 is applied to the wiring 105 connected to the source terminal of the transistor 102 and the wiring 106 connected to the source terminal of the transistor 103.

In the semiconductor device illustrated in FIG. 1A, the output-side transistor 103 for controlling the output of the potential of the wiring 106 is normally on. However, in one embodiment of the present invention, even when an output-side transistor for controlling the output of the potential of the wiring 104 is normally on, the output-side transistor can be turned off when it should be turned off. The operation of the semiconductor device according to one embodiment of the present invention is described below, noting the output-side transistor for controlling the output of the potential of the wiring 104.

Figure 1B:
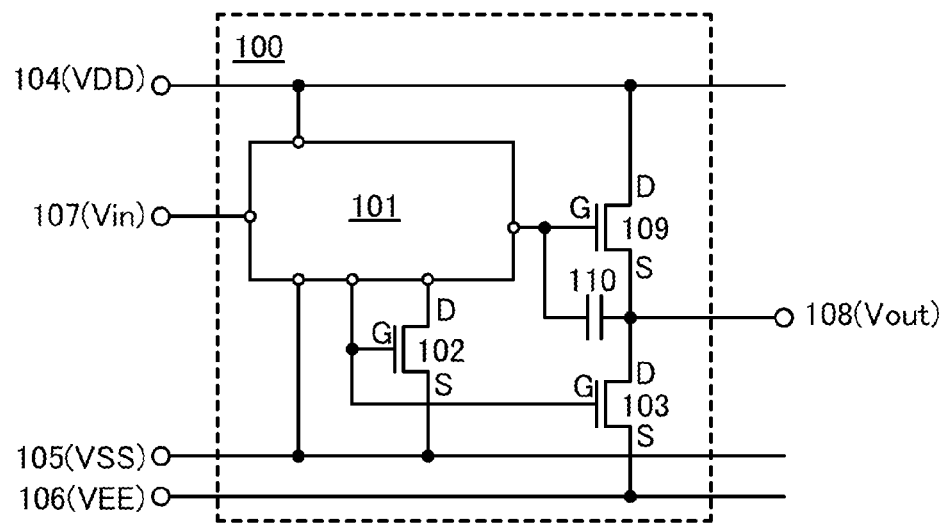

FIG. 1B illustrates another circuit structure example of the semiconductor device according to one embodiment of the present invention. The semiconductor device 100 illustrated in FIG. 1B includes the circuit 101 having a plurality of transistors, the transistor 102, the transistor 103, a transistor 109, and a capacitor 110. In the semiconductor device 100, at least the transistors 102, 103, and 109 have the same polarity. In FIG. 1B, the transistors 102, 103, and 109 are n-channel transistors.

In the semiconductor device 100 illustrated in FIG. 1B, unlike in FIG. 1A, the gate of the transistor 103 is connected to the circuit 101, and the drain terminal of the transistor 103 is connected to a source terminal of the transistor 109 and the wiring 108. A gate of the transistor 109 is connected to the circuit 101. In accordance with the potential Vin, the circuit 101 applies one of the potential VDD and the potential VSS to the gate of the transistor 103 and applies the other potential to the gate of the transistor 109. The potential VEE is applied to the source terminal of the transistor 103 through the wiring 106. The potential VDD is applied to a drain terminal of the transistor 109 through the wiring 104.

The capacitor 110 has a function of holding the gate voltage of the transistor 109. Note that in the case where the gate voltage of the transistor 109 can be held without provision of the capacitor 110, for example, in the case where the parasitic capacitance of the gate of the transistor 109 is high, the capacitor 110 is not necessarily provided.

Next, the operation of the semiconductor device 100 in the case of the normally-on transistors 102, 103, and 109 is described in detail below.

Taking VSS−VEE>Vth, the transistors 102 and 103 are turned on when the potential VDD is applied to the gates of the transistors 102 and 103. When the potential VDD is applied to the gates of the transistors 102 and 103, the potential VSS is applied to the gate of the transistor 109. Thus, the gate voltage Vgs of the transistor 109 equals VSS−VEE>Vth, so that the transistor 109 is on though it should be off. Consequently, current flows between the wirings 106 and 104 through the transistors 109 and 103, the potential of the wiring 104 decreases, and the potential of the wiring 105 increases.

However, in one embodiment of the present invention, when the potential of the wiring 106 is raised from the potential VEE to the potential VEE+Vα, the gate voltage Vgs of the transistor 109 is decreased to the threshold voltage Vth, and eventually the transistor 109 is almost turned off. Specifically, when the potential VSS equals the potential VEE+Vα+Vth, the transistor 109 is turned off. Thus, even when the transistor 109 is normally on, the transistor 109 can be almost turned off when it should be turned off.

Taking VSS−VEE≤Vth, the gate voltage Vgs equals VSS−VEE≤Vth when the potential VSS is applied to the gate of the transistor 109. Thus, in that case, even when the transistor 109 is normally on, the transistor 109 can be turned off.

In this manner, in the semiconductor device 100 according to one embodiment of the present invention, the source terminal of the output-side transistor 103 and the source terminal of a transistor other than the transistor 103 (e.g., the transistor 102) are supplied with the different wirings 106 and 105, respectively, so that negative feedback can be performed in order that the gate voltage of the transistor 109 is close to the threshold voltage when the drain current of the transistor 109 is high. Accordingly, even when the transistor 109 is normally on, the transistor 109 can be turned off. Consequently, even when the resistance of each wiring decreases the potential of the wiring 104 and increases the potential of the wiring 105, the power consumption of the semiconductor device 100 can be reduced. Further, a decrease in amplitude of the potential Vout output from the semiconductor device 100 can be prevented.

Note that although the transistors 102, 103, and 109 are n-channel transistors in FIG. 1B, the transistors 102, 103, and 109 may be p-channel transistors. In such a case, a potential that is higher than the potential of the wiring 104 is applied to the wiring 105 connected to the source terminal of the transistor 102 and the wiring 106 connected to the source terminal of the transistor 103.

Figure 2:
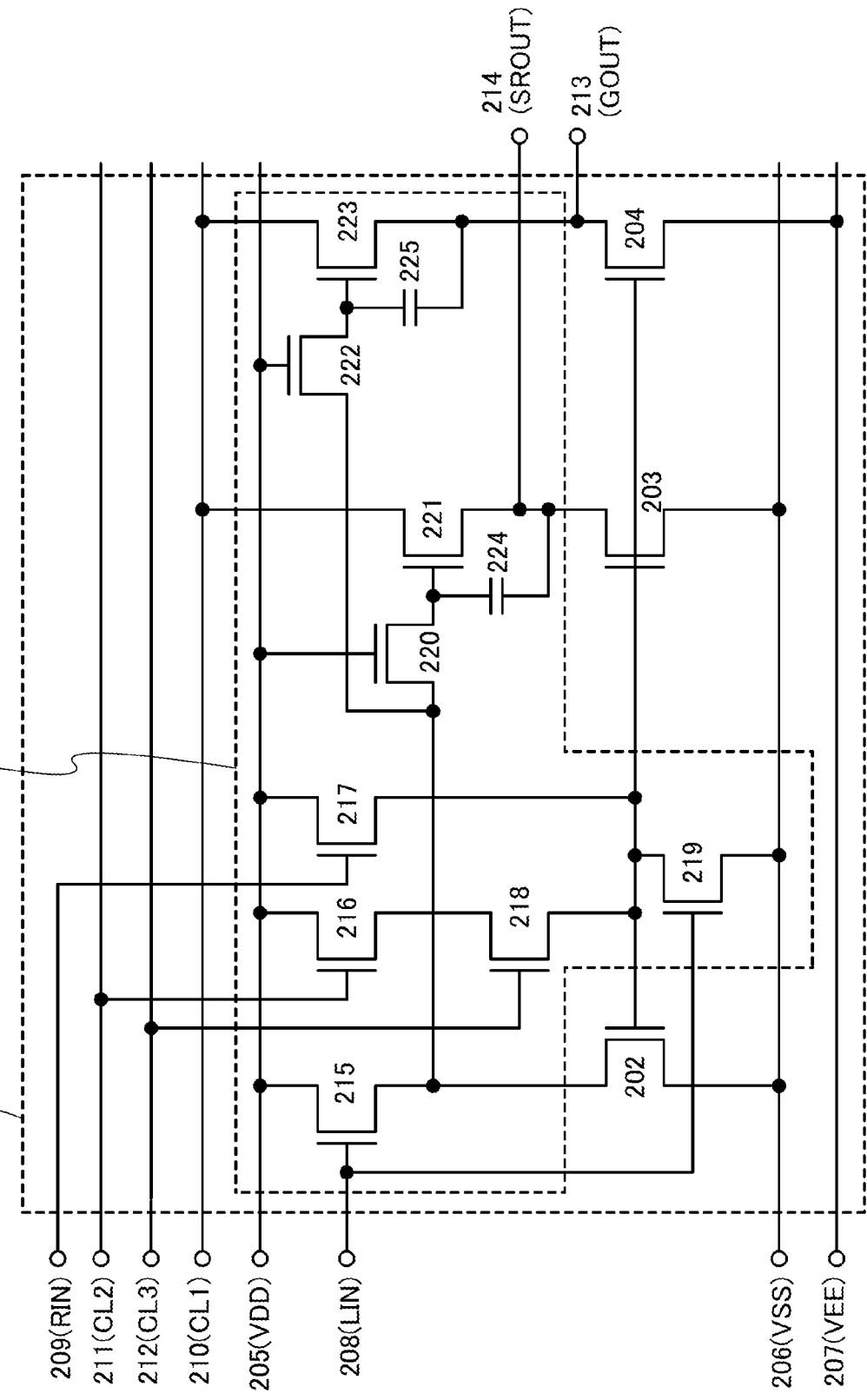
FIG. 2 illustrates the structure of a pulse generator.

Next, a pulse generator that is one of the semiconductor devices according to one embodiment of the present invention is described. FIG. 2 illustrates an example of a pulse generator according to one embodiment of the present invention.

A pulse generator 200 illustrated in FIG. 2 includes a circuit 201 and transistors 202 to 204. The circuit 201 corresponds to the circuit 101 illustrated in FIG. 1A. The transistors 202 and 203 each correspond to the transistor 102 illustrated in FIG. 1A. The transistor 204 corresponds to the transistor 103 illustrated in FIG. 1A. The pulse generator 200 is supplied with a variety of potentials from wirings 205 to 212, and outputs potentials to wirings 213 and 214.

A shift register can be constituted by connecting the plurality of pulse generators 200 to each other.

In the case where the transistors 202 and 203 are n-channel transistors, specifically, the potential VDD is applied to the wiring 205, the potential VSS is applied to the wiring 206, and the potential VEE is applied to the wiring 207. A potential LIN is applied to the wiring 208, and a potential RIN is applied to the wiring 209. The potentials LIN and RIN each correspond to the potential Vin in the semiconductor device 100 illustrated in FIG. 1A.

Potentials of three of clock signals CL1 to CL4 are applied to the wirings 210 to 212. In FIG. 2, the potential of the clock signal CL1, the potential of the clock signal CL2, and the potential of the clock signal CL3 are applied to the wiring 210, the wiring 211, and the wiring 212, respectively.

A gate of the transistor 202 is connected to gates of the transistors 203 and 204. A source terminal of the transistor 202 is connected to the wiring 206. A drain terminal of the transistor 202 is connected to the circuit 201. A source terminal of the transistor 203 is connected to the wiring 206. A drain terminal of the transistor 203 is connected to the circuit 201. A source terminal of the transistor 204 is connected to the wiring 207. A drain terminal of the transistor 204 is connected to the circuit 201 and the wiring 213.

The circuit 201 further includes transistors 215 to 223 and capacitors 224 and 225. Specifically, a gate of the transistor 215 is connected to the wiring 208. A source terminal of the transistor 215 is connected to the drain terminal of the transistor 202. A drain terminal of the transistor 215 is connected to the wiring 205. A gate of the transistor 216 is connected to the wiring 211. A source terminal of the transistor 216 is connected to a drain terminal of the transistor 218. A drain terminal of the transistor 216 is connected to the wiring 205. A gate of the transistor 217 is connected to the wiring 209. A source terminal of the transistor 217 is connected to the gates of the transistors 202 to 204. A drain terminal of the transistor 217 is connected to the wiring 205. A gate of the transistor 218 is connected to the wiring 212. A source terminal of the transistor 218 is connected to the gates of the transistors 202 to 204. A gate of the transistor 219 is connected to the wiring 208. A source terminal of the transistor 219 is connected to the wiring 206. A drain terminal of the transistor 219 is connected to the gates of the transistors 202 to 204. A gate of the transistor 220 is connected to the wiring 205. One of a source terminal and a drain terminal of the transistor 220 is connected to the source terminal of the transistor 215 and the drain terminal of the transistor 202. The other of the source terminal and the drain terminal of the transistor 220 is connected to a gate of the transistor 221. A source terminal of the transistor 221 is connected to the wiring 214. A drain terminal of the transistor 221 is connected to the wiring 210. A gate of the transistor 222 is connected to the wiring 205. One of a source terminal and a drain terminal of the transistor 222 is connected to the source terminal of the transistor 215 and the drain terminal of the transistor 202.

The other of the source terminal and the drain terminal of the transistor 222 is connected to a gate of the transistor 223. A source terminal of the transistor 223 is connected to the wiring 213. A drain terminal of the transistor 223 is connected to the wiring 210. One electrode of the capacitor 224 is connected to the gate of the transistor 221. The other electrode of the capacitor 224 is connected to the wiring 214. One electrode of the capacitor 225 is connected to the gate of the transistor 223. The other electrode of the capacitor 225 is connected to the wiring 213.

The operation of the pulse generator 200 illustrated in FIG. 2 is described with reference to a timing chart in FIG. 3.

Figure 3:
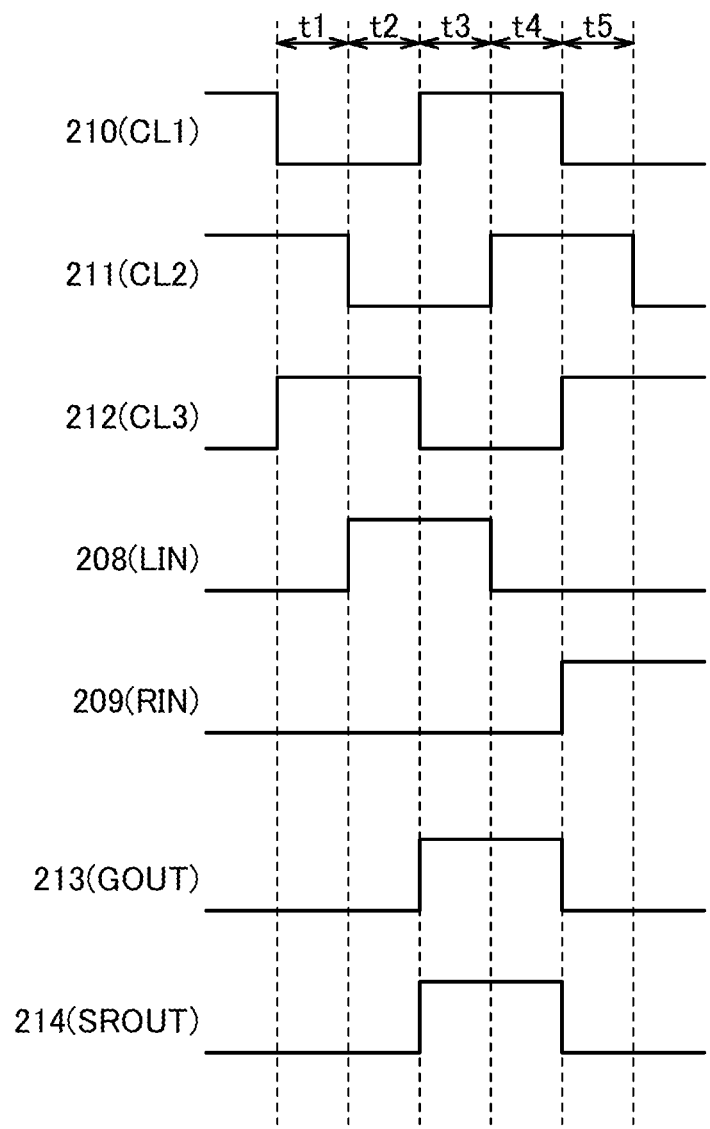
FIG. 3 is a timing chart of the pulse generator.

As illustrated in FIG. 3, in a period t1, the potential of the clock signal CL1 that is applied to the wiring 210 is low; the potential of the clock signal CL2 that is applied to the wiring 211 is high; the potential of the clock signal CL3 that is applied to the wiring 212 is high; the potential LIN applied to the wiring 208 is low; and the potential RIN applied to the wiring 209 is low.

Thus, in the period t1, in the pulse generator 200, the transistors 202, 203, 204, 216, 218, 220, and 222 are turned on. Further, the transistors 215, 217, 219, 221, and 223 are turned off. Thus, the potential of the wiring 207 is output from the wiring 213 as a potential GOUT. Further, the potential of the wiring 206 is output from the wiring 214 as a potential SROUT.

Next, as illustrated in FIG. 3, in a period t2, the potential of the clock signal CL1 that is applied to the wiring 210 is low; the potential of the clock signal CL2 that is applied to the wiring 211 is low; the potential of the clock signal CL3 that is applied to the wiring 212 is high; the potential LIN applied to the wiring 208 is high; and the potential RIN applied to the wiring 209 is low.

Thus, in the period t2, in the pulse generator 200, the transistors 215, 218, 219, 220, 221, 222, and 223 are turned on. Further, the transistors 202, 203, 204, 216, and 217 are turned off. Thus, the potential of the wiring 210 is output from the wiring 213 as the potential GOUT and is output from the wiring 214 as the potential SROUT.

Next, as illustrated in FIG. 3, in a period t3, the potential of the clock signal CL1 that is applied to the wiring 210 is high; the potential of the clock signal CL2 that is applied to the wiring 211 is low; the potential of the clock signal CL3 that is applied to the wiring 212 is low; the potential LIN applied to the wiring 208 is high; and the potential RIN applied to the wiring 209 is low.

Thus, in the period t3, in the pulse generator 200, the transistors 215, 219, 221, and 223 are turned on. Further, the transistors 202, 203, 204, 216, 217, 218, 220, and 222 are turned off. Thus, the potential of the wiring 210 is output from the wiring 213 as the potential GOUT and is output from the wiring 214 as the potential SROUT.

Next, as illustrated in FIG. 3, in a period t4, the potential of the clock signal CL1 that is applied to the wiring 210 is high; the potential of the clock signal CL2 that is applied to the wiring 211 is high; the potential of the clock signal CL3 that is applied to the wiring 212 is low; the potential LIN applied to the wiring 208 is low; and the potential RIN applied to the wiring 209 is low.

Thus, in the period t4, in the pulse generator 200, the transistors 216, 221, and 223 are turned on. Further, the transistors 202, 203, 204, 215, 217, 218, 219, 220, and 222 are turned off. Thus, the potential of the wiring 210 is output from the wiring 213 as the potential GOUT and is output from the wiring 214 as the potential SROUT.

Next, as illustrated in FIG. 3, in a period t5, the potential of the clock signal CL1 that is applied to the wiring 210 is low; the potential of the clock signal CL2 that is applied to the wiring 211 is high; the potential of the clock signal CL3 that is applied to the wiring 212 is high; the potential LIN applied to the wiring 208 is low; and the potential RIN applied to the wiring 209 is high.

Thus, in the period t5, in the pulse generator 200, the transistors 202, 203, 204, 216, 217, 218, 220, and 222 are turned on. Further, the transistors 215, 219, 221, and 223 are turned off. Thus, the potential of the wiring 207 is output from the wiring 213 as the potential GOUT. Further, the potential of the wiring 206 is output from the wiring 214 as the potential SROUT.

Note that in the above operation, the transistor 204 is turned off in the periods t2 to t4. In particular, in the periods t3 and t4, since the potential of the clock signal CL1 that is applied to the wiring 210 is high, current flows between the wirings 210 and 207 through the transistors 204 and 223 when the transistor 204 is on. However, in one embodiment of the present invention, the gate and the source terminal of the transistor 204 are electrically isolated from each other. Specifically, when the transistor 204 is turned off, the potential of the wiring 206 can be applied to the gate of the transistor 204, and the potential of the wiring 207 can be applied to the source terminal of the transistor 204. Thus, even when current flows between the wirings 210 and 207, the current increases the potential of the wiring 207, and the gate voltage Vgs of the transistor 204 becomes close to the threshold voltage Vth. Consequently, the transistor 204 can be eventually turned off.

Figure 4:
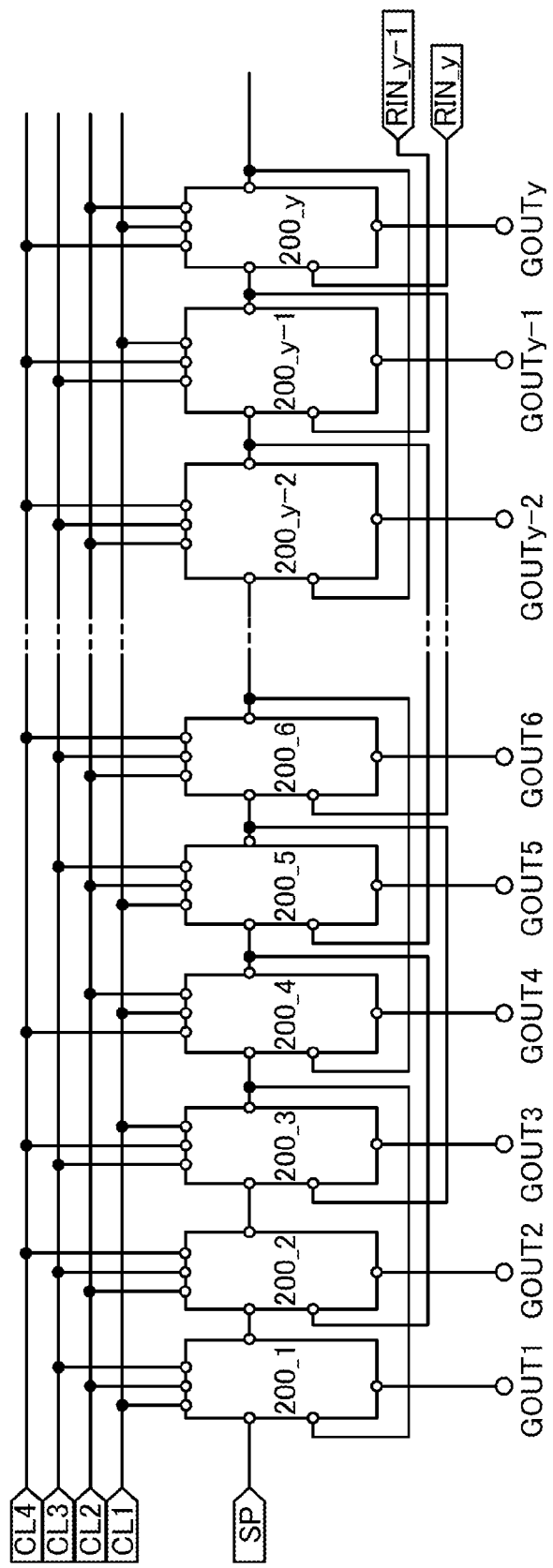
FIG. 4 illustrates the structure of a shift register.

FIG. 4 illustrates an example of a shift register obtained by connecting the plurality of pulse generators 200 to each other.

The shift register illustrated in FIG. 4 includes pulse generators 200_1 to 200_y. The pulse generators 200_1 to 200_y each have the same structure as the pulse generator 200 illustrated in FIG. 2. Note that potentials of three of the clock signals CL1 to CL4 are applied to the wirings 210 to 212 illustrated in FIG. 2.

Specifically, in a pulse generator 200_4m+1, the clock signal CL1, the clock signal CL2, and the clock signal CL3 are applied to the wiring 210, the wiring 211, and the wiring 212, respectively. In a pulse generator 200_4m+2, the clock signal CL2, the clock signal CL3, and the clock signal CL4 are applied to the wiring 210, the wiring 211, and the wiring 212, respectively. In a pulse generator 200_4m+3, the clock signal CL3, the clock signal CL4, and the clock signal CL1 are applied to the wiring 210, the wiring 211, and the wiring 212, respectively. In a pulse generator 200_4m+4, the clock signal CL4, the clock signal CL1, and the clock signal CL2 are applied to the wiring 210, the wiring 211, and the wiring 212, respectively. Note that m is a given integer number that meets the condition that the total number of pulse generators 200 is y.

Figure 6:
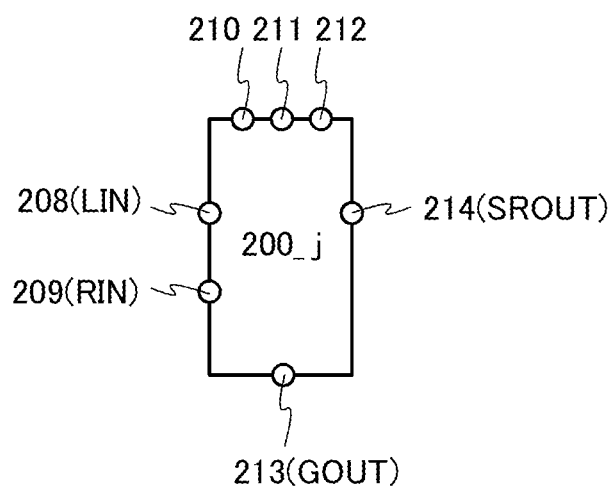
FIG. 6 schematically illustrates a j-th pulse generator 200_j.

FIG. 6 schematically illustrates the positions of the wirings 208 to 214 of a pulse generator 200_j (j is a natural number of y or smaller) in the shift register in FIG. 4. As can be seen from FIG. 4 and FIG. 6, a potential SROUTj−1 output from the wiring 214 of a previous pulse generator 200_j−1 is applied to the wiring 208 of the pulse generator 200_j as the potential LN. Note that the potential of a start pulse signal SP is applied to the wiring 208 of the first pulse generator 200_1.

A potential SROUTj+2 output from the wiring 214 of a pulse generator 200_j+2 that is two stages after the current stage is applied to the wiring 209 of the pulse generator 200_j as the potential RN. Note that a potential RIN_y−1 is applied to the wiring 208 of a (y−1)th pulse generator 200_y−1, and a potential RIN_y is applied to the wiring 208 of the y-th pulse generator 200_y. The potential RIN_y−1 is a potential SROUTy+1 output from a pulse generator 200_y+1 assuming that the pulse generator 200_y+1 is provided. Further, the potential RIN_y is a potential SROUTy+2 output from a pulse generator 200_y+2 assuming that the pulse generator 200_y+2 is provided.

A potential GOUTj is output from the wiring 213 of the pulse generator 200_j.

Figure 5:
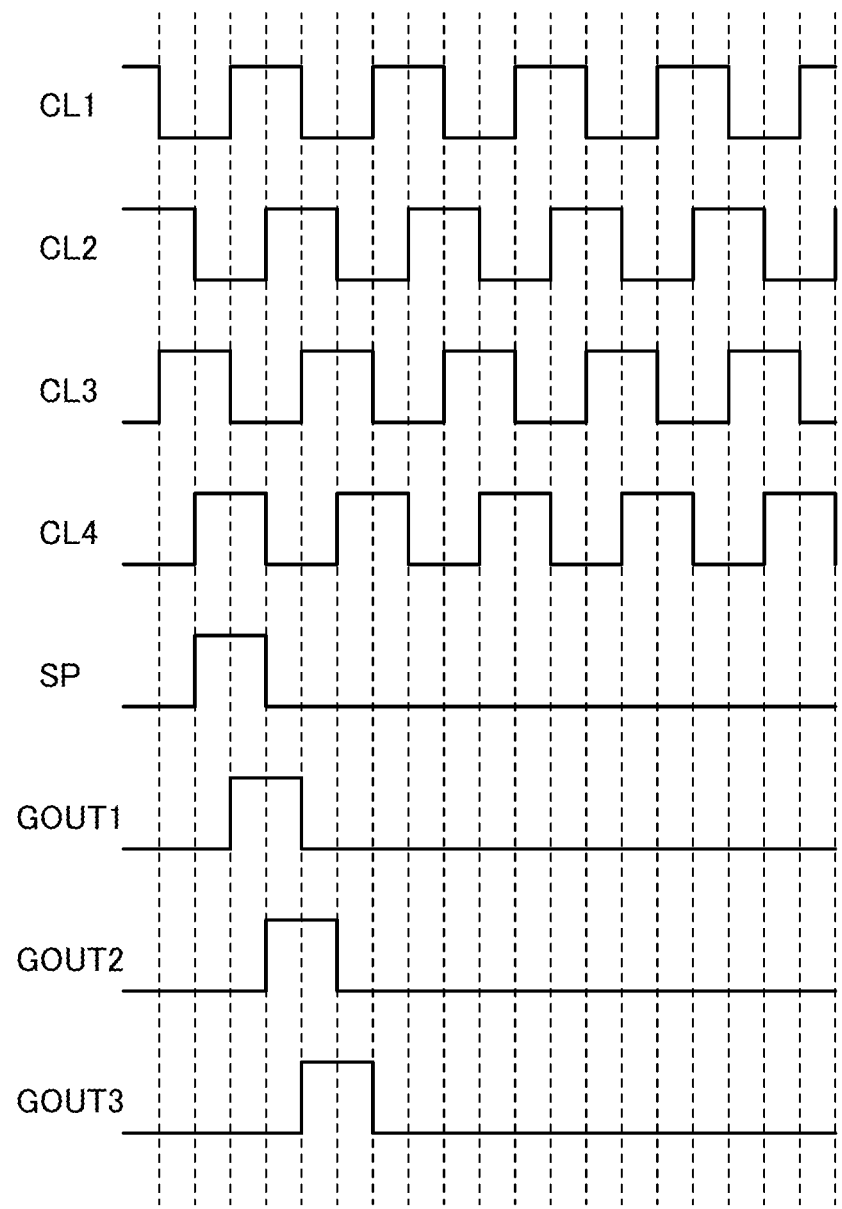
FIG. 5 is a timing chart of the shift register.

FIG. 5 is a timing chart of the potentials of the clock signals CL1 to CL4, the potential of the start pulse signal SP, and the potentials GOUT1 to GOUT3. The clock signals CL1 to CL4 have waveforms whose potential rise timings are shifted backward by ¼ period. The shift register illustrated in FIG. 4 operates in response to the signals. The shift register illustrated in FIG. 4 outputs the potential GOUT1 to a potential GOUTy having half the pulse widths of the clock signals and waveforms whose pulses are shifted backward by ¼ period.

For example, in the case where the shift register illustrated in FIG. 4 supplies the potentials GOUT1 to GOUTy to wirings called bus lines (e.g., scan lines or signal lines) of the semiconductor display device, the output-side transistors 204 in the pulse generators 200_1 to 200_y need high current supply capability. Thus, the channel width W of the transistor 204 is made larger than the channel width W of a transistor other than the transistor 204 in many cases. Consequently, when the transistor 204 is normally on, an increase in power consumption of the shift register or a decrease in amplitude of the output potentials GOUT1 to GOUTy remarkably occurs. However, in one embodiment of the present invention, even when the output-side transistors 204 in the pulse generators 200_1 to 200_y are normally on, the transistors 204 can be turned off when they should be turned off.

Thus, the above shift register according to one embodiment of the present invention consumes less power and can prevent a decrease in amplitude of the output potentials GOUT1 to GOUTy. A semiconductor display device according to one embodiment of the present invention that includes the above shift register consumes less power and can prevent a display defect due to a small amplitude of a signal supplied to the bus line.

Figure 7A:
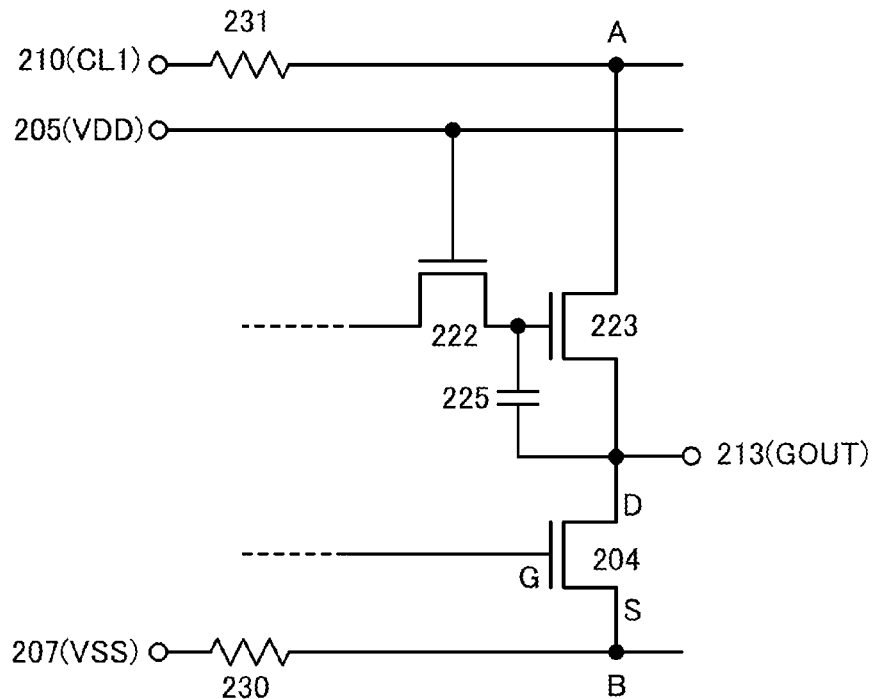
FIG. 7A illustrates the structure of a pulse generator (a comparison example)

The case where the wirings 206 and 207 are electrically connected to each other in the pulse generator 200 illustrated in FIG. 2 is considered as a comparison example. FIG. 7A illustrates the connection relation of the transistor 204, the transistor 222, the transistor 223, the capacitor 225, the wiring 205, the wiring 207, and the wiring 210 included in a pulse generator that is the comparison example. In the pulse generator that is the comparison example, the wiring 207 is connected to the wiring 206 (not illustrated) and is supplied with the potential VSS.

FIG. 7A illustrates the resistance of the wiring 207 and the resistance of the wiring 210 as a resistor 230 and a resistor 231, respectively.

Note that an amorphous silicon or oxide semiconductor transistor is normally on in some cases, as described above. For example, in the case where the transistor has a channel length L of 6 μm and a channel width W of 10 μm, current that flows in the case of a gate voltage Vgs of 0 V is assumed to be 0.5 μA. In order to increase the current supply capability of the transistor, its channel width W is increased to approximately 1000 μm in many cases. When the channel width of the transistor having the above current voltage characteristics is increased from 10 μm to 1000 μm, current that flows in the case of a gate voltage Vgs of 0 V is 100 times larger (0.05 mA).

Assuming that each pulse generator wastes a current of 0.05 mA, in the case where the number of pulse generators in the shift register is 960, a current of approximately 50 mA flows in the entire shift register.

In addition, assume that the resistor 230 and the resistor 231 each have a resistance of 100Ω. Further, assume that the transistor 204 is normally on and that a current of 0.05 mA flows when the gate voltage Vgs is 0 V as described above. When a portion where the drain terminal of the transistor 223 is connected to the wiring 210 is denoted by a node A and a portion where the source terminal of the transistor 204 is connected to the wiring 207 is denoted by a node B, the potential of the node A is decreased and the potential of the node B is increased when current flows to the transistor 204. The increase in potential of the wiring 207 corresponds to the product of current flowing to the transistor 204, the resistance of the resistor 230, and the number of shift registers. The decrease in potential of the wiring 210 corresponds to the product of current flowing to the transistor 204, the resistance of the resistor 231, and the number of shift registers. Thus, the decrease in potential and the increase in potential are each up to 5 V.

Figure 7B:
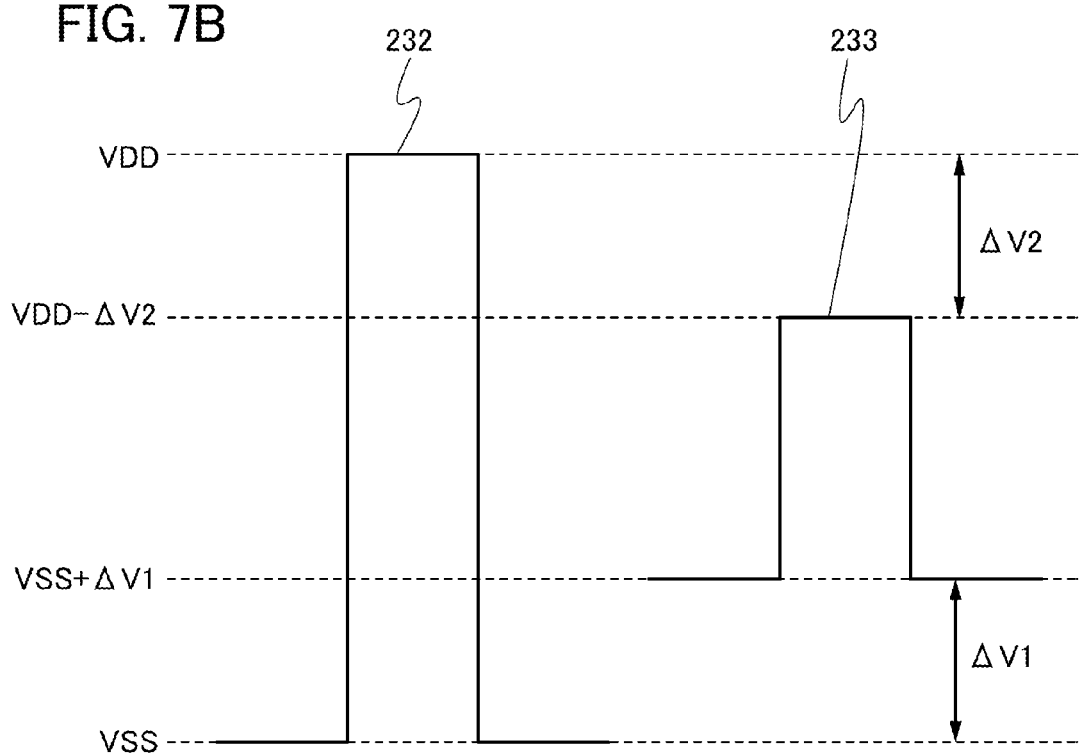
FIG. 7B shows the waveform of a potential GROUT.

In FIG. 7B, an ideal waveform of the potential GOUT output from the wiring 213 is shown in a solid line 232. The pulse potential difference of the ideal potential GOUT corresponds to a difference between the potentials VSS and VDD. In FIG. 7B, the waveform of the potential GOUT output from the wiring 213, in the case where the potential of the wiring 207 is increased and the potential of the wiring 210 is decreased, is shown in a solid line 233. The pulse potential difference of the potential GOUT shown in the solid line 233 corresponds to a difference between the potential VSS+ΔV1 and the potential VDD−ΔV2. In the above example, ΔV1 and ΔV2 are each approximately 5 V; thus, it is clear that the amplitude is greatly decreased from the original amplitude.

However, in one embodiment of the present invention, even when the output-side transistor 204 is normally on, the transistor 204 can be turned off. Thus, a decrease in amplitude of the output potential GOUT can be prevented, and power consumption can be reduced.

Embodiment 2

Structure examples of pulse generators according to one embodiment of the present invention are described.

Figure 8A:
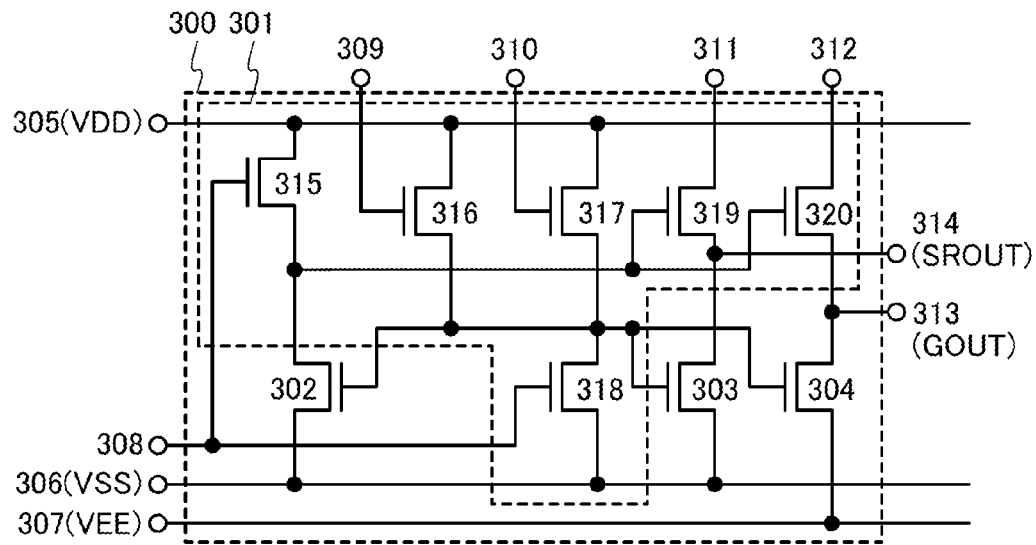
FIGS. 8A and 8B each illustrate the structure of a pulse generator.

A pulse generator 300 illustrated in FIG. 8A includes a circuit 301 and transistors 302 to 304. The circuit 301 corresponds to the circuit 101 illustrated in FIG. 1A. The transistors 302 and 303 each correspond to the transistor 102 illustrated in FIG. 1A. The transistor 304 corresponds to the transistor 103 illustrated in FIG. 1A.

A shift register can be constituted by connecting the plurality of pulse generators 300 to each other.

A gate of the transistor 302 is connected to gates of the transistors 303 and 304. A source terminal of the transistor 302 is connected to a wiring 306. A drain terminal of the transistor 302 is connected to the circuit 301. A source terminal of the transistor 303 is connected to the wiring 306. A drain terminal of the transistor 303 is connected to the circuit 301 and a wiring 314. A source terminal of the transistor 304 is connected to a wiring 307. A drain terminal of the transistor 304 is connected to the circuit 301 and a wiring 313.

The circuit 301 further includes transistors 315 to 320. Specifically, a gate of the transistor 315 is connected to a wiring 308. A source terminal of the transistor 315 is connected to the drain terminal of the transistor 302. A drain terminal of the transistor 315 is connected to a wiring 305. A gate of the transistor 316 is connected to a wiring 309. A source terminal of the transistor 316 is connected to the gates of the transistors 302 to 304. A drain terminal of the transistor 316 is connected to the wiring 305. A gate of the transistor 317 is connected to a wiring 310. A source terminal of the transistor 317 is connected to the gates of the transistors 302 to 304. A drain terminal of the transistor 317 is connected to the wiring 305. A gate of the transistor 318 is connected to the wiring 308. A source terminal of the transistor 318 is connected to the wiring 306. A drain terminal of the transistor 318 is connected to the gates of the transistors 302 to 304. A gate of the transistor 319 is connected to the source terminal of the transistor 315 and the drain terminal of the transistor 302. A source terminal of the transistor 319 is connected to the wiring 314. A drain terminal of the transistor 319 is connected to a wiring 311. A gate of the transistor 320 is connected to the source terminal of the transistor 315 and the drain terminal of the transistor 302. A source terminal of the transistor 320 is connected to the wiring 313. A drain terminal of the transistor 320 is connected to a wiring 312.

In the case where the transistors 302 to 304 are n-channel transistors, specifically, the potential VDD is applied to the wiring 305, the potential VSS is applied to the wiring 306, and the potential VEE is applied to the wiring 307. Potentials of a variety of signals such as clock signals are applied to the wirings 308 to 312 in addition to the potential Vin in the semiconductor device 100 illustrated in FIG. 1A. The potential GOUT and the potential SROUT are output from the wiring 313 and the wiring 314, respectively.

In the pulse generator 300 illustrated in FIG. 8A, the above structure can electrically isolate the gate and the source terminal of the output-side transistor 304 from each other. Thus, even when the transistor 304 is normally on and thus the potential of the wiring 307 for supplying a potential to the source terminal of the transistor 304 is raised, the transistor 304 can be turned off when it should be turned off.

Figure 8B:
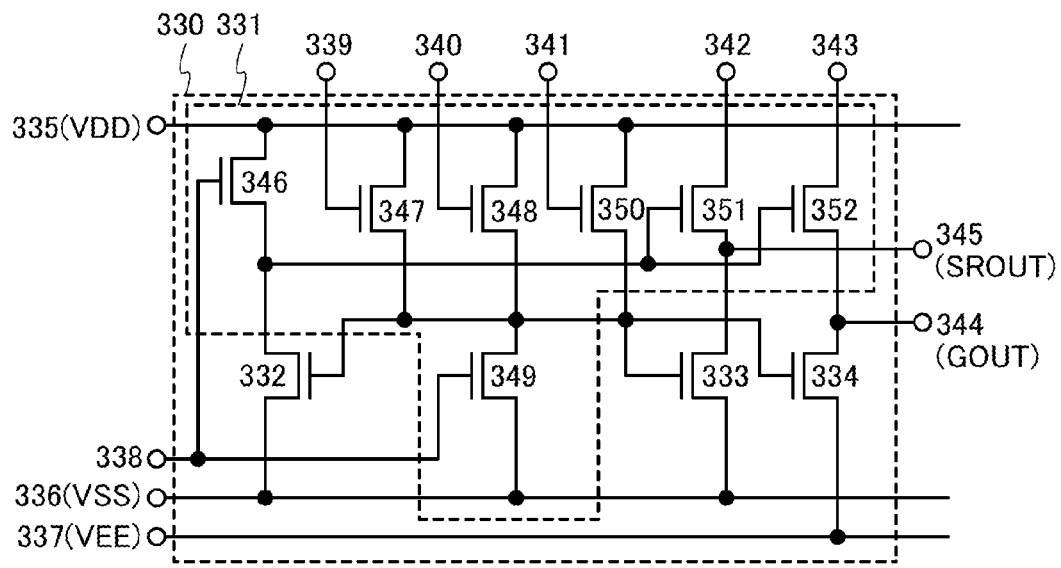

A pulse generator 330 illustrated in FIG. 8B includes a circuit 331 and transistors 332 to 334. The circuit 331 corresponds to the circuit 101 illustrated in FIG. 1A. The transistors 332 and 333 each correspond to the transistor 102 illustrated in FIG. 1A. The transistor 334 corresponds to the transistor 103 illustrated in FIG. 1A.

A gate of the transistor 332 is connected to gates of the transistors 333 and 334. A source terminal of the transistor 332 is connected to a wiring 336. A drain terminal of the transistor 332 is connected to the circuit 331. A source terminal of the transistor 333 is connected to the wiring 336. A drain terminal of the transistor 333 is connected to the circuit 331 and a wiring 345. A source terminal of the transistor 334 is connected to a wiring 337. A drain terminal of the transistor 334 is connected to the circuit 331 and a wiring 344.

The circuit 331 further includes transistors 346 to 352. Specifically, a gate of the transistor 346 is connected to a wiring 338. A source terminal of the transistor 346 is connected to the drain terminal of the transistor 332. A drain terminal of the transistor 346 is connected to a wiring 335. A gate of the transistor 347 is connected to a wiring 339. A source terminal of the transistor 347 is connected to the gates of the transistors 332 to 334. A drain terminal of the transistor 347 is connected to the wiring 335. A gate of the transistor 348 is connected to a wiring 340. A source terminal of the transistor 348 is connected to the gates of the transistors 332 to 334. A drain terminal of the transistor 348 is connected to the wiring 335. A gate of the transistor 349 is connected to the wiring 338. A source terminal of the transistor 349 is connected to the wiring 336. A drain terminal of the transistor 349 is connected to the gates of the transistors 332 to 334. A gate of the transistor 350 is connected to a wiring 341. A source terminal of the transistor 350 is connected to the gates of the transistors 332 to 334. A drain terminal of the transistor 350 is connected to the wiring 335. A gate of the transistor 351 is connected to the source terminal of the transistor 346 and the drain terminal of the transistor 332. A source terminal of the transistor 351 is connected to the wiring 345. A drain terminal of the transistor 351 is connected to a wiring 342. A gate of the transistor 352 is connected to the source terminal of the transistor 346 and the drain terminal of the transistor 332. A source terminal of the transistor 352 is connected to the wiring 344. A drain terminal of the transistor 352 is connected to a wiring 343.

In the case where the transistors 332 to 334 are n-channel transistors, specifically, the potential VDD is applied to the wiring 335, the potential VSS is applied to the wiring 336, and the potential VEE is applied to the wiring 337. Potentials of a variety of signals such as clock signals are applied to the wirings 338 to 343 in addition to the potential Vin in the semiconductor device 100 illustrated in FIG. 1A. The potential GOUT and the potential SROUT are output from the wiring 344 and the wiring 345, respectively.

In the pulse generator 330 illustrated in FIG. 8B, the above structure can electrically isolate the gate and the source terminal of the output-side transistor 334 from each other. Thus, even when the transistor 334 is normally on and thus the potential of the wiring 337 for supplying a potential to the source terminal of the transistor 334 is raised, the transistor 334 can be turned off when it should be turned off.

Figure 9A:
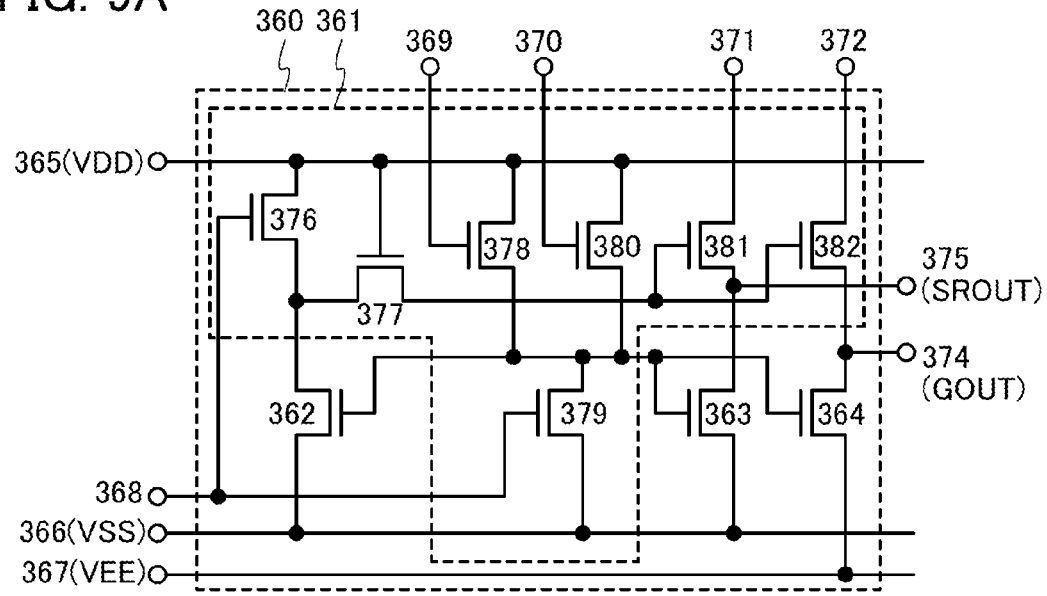
FIGS. 9A and 9B each illustrate the structure of a pulse generator.

A pulse generator 360 illustrated in FIG. 9A includes a circuit 361 and transistors 362 to 364. The circuit 361 corresponds to the circuit 101 illustrated in FIG. 1A. The transistors 362 and 363 each correspond to the transistor 102 illustrated in FIG. 1A. The transistor 364 corresponds to the transistor 103 illustrated in FIG. 1A.

A shift register can be constituted by connecting the plurality of pulse generators 360 to each other.

A gate of the transistor 362 is connected to gates of the transistors 363 and 364. A source terminal of the transistor 362 is connected to a wiring 366. A drain terminal of the transistor 362 is connected to the circuit 361. A source terminal of the transistor 363 is connected to the wiring 366. A drain terminal of the transistor 363 is connected to the circuit 361 and a wiring 375. A source terminal of the transistor 364 is connected to a wiring 367. A drain terminal of the transistor 364 is connected to the circuit 361 and a wiring 374.

The circuit 361 further includes transistors 376 to 382. Specifically, a gate of the transistor 376 is connected to a wiring 368. A source terminal of the transistor 376 is connected to the drain terminal of the transistor 362. A drain terminal of the transistor 376 is connected to a wiring 365. A gate of the transistor 377 is connected to the wiring 365. One of a source terminal and a drain terminal of the transistor 377 is connected to the source terminal of the transistor 376 and the drain terminal of the transistor 362. The other of the source terminal and the drain terminal of the transistor 377 is connected to gates of the transistors 381 and 382. A gate of the transistor 378 is connected to a wiring 369. A source terminal of the transistor 378 is connected to the gates of the transistors 362 to 364. A drain terminal of the transistor 378 is connected to the wiring 365. A gate of the transistor 379 is connected to the wiring 368. A source terminal of the transistor 379 is connected to the wiring 366. A drain terminal of the transistor 379 is connected to the gates of the transistors 362 to 364. A gate of the transistor 380 is connected to a wiring 370. A source terminal of the transistor 380 is connected to the gates of the transistors 362 to 364. A drain terminal of the transistor 380 is connected to the wiring 365. A source terminal of the transistor 381 is connected to the wiring 375. A drain terminal of the transistor 381 is connected to a wiring 371. A source terminal of the transistor 382 is connected to the wiring 374. A drain terminal of the transistor 382 is connected to a wiring 372.

In the case where the transistors 362 to 364 are n-channel transistors, specifically, the potential VDD is applied to the wiring 365, the potential VSS is applied to the wiring 366, and the potential VEE is applied to the wiring 367. Potentials of a variety of signals such as clock signals are applied to the wirings 368 to 372 in addition to the potential Vin in the semiconductor device 100 illustrated in FIG. 1A. The potential GOUT and the potential SROUT are output from the wiring 374 and the wiring 375, respectively.

In the pulse generator 360 illustrated in FIG. 9A, the above structure can electrically isolate the gate and the source terminal of the output-side transistor 364 from each other. Thus, even when the transistor 364 is normally on and thus the potential of the wiring 367 for supplying a potential to the source terminal of the transistor 364 is raised, the transistor 364 can be turned off when it should be turned off.

Figure 9B:
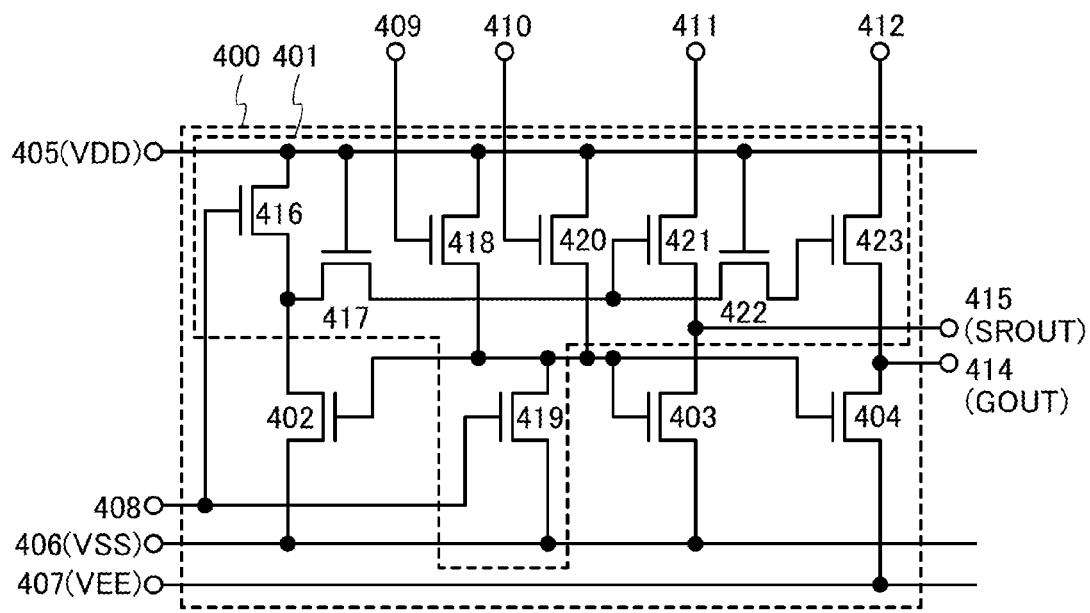

A pulse generator 400 illustrated in FIG. 9B includes a circuit 401 and transistors 402 to 404. The circuit 401 corresponds to the circuit 101 illustrated in FIG. 1A. The transistors 402 and 403 each correspond to the transistor 102 illustrated in FIG. 1A. The transistor 404 corresponds to the transistor 103 illustrated in FIG. 1A.

A shift register can be constituted by connecting the plurality of pulse generators 400 to each other.

A gate of the transistor 402 is connected to gates of the transistors 403 and 404. A source terminal of the transistor 402 is connected to a wiring 406. A drain terminal of the transistor 402 is connected to the circuit 401. A source terminal of the transistor 403 is connected to the wiring 406. A drain terminal of the transistor 403 is connected to the circuit 401 and a wiring 415. A source terminal of the transistor 404 is connected to a wiring 407. A drain terminal of the transistor 404 is connected to the circuit 401 and a wiring 414.

The circuit 401 further includes transistors 416 to 423. Specifically, a gate of the transistor 416 is connected to a wiring 408. A source terminal of the transistor 416 is connected to the drain terminal of the transistor 402. A drain terminal of the transistor 416 is connected to a wiring 405. A gate of the transistor 417 is connected to the wiring 405. One of a source terminal and a drain terminal of the transistor 417 is connected to the source terminal of the transistor 416 and the drain terminal of the transistor 402. The other of the source terminal and the drain terminal of the transistor 417 is connected to a gate of the transistor 421. A gate of the transistor 418 is connected to a wiring 409. A source terminal of the transistor 418 is connected to the gates of the transistors 402 to 404. A drain terminal of the transistor 418 is connected to the wiring 405. A gate of the transistor 419 is connected to the wiring 408. A source terminal of the transistor 419 is connected to the wiring 406. A drain terminal of the transistor 419 is connected to the gates of the transistors 402 to 404. A gate of the transistor 420 is connected to a wiring 410. A source terminal of the transistor 420 is connected to the gates of the transistors 402 to 404. A drain terminal of the transistor 420 is connected to the wiring 405. A source terminal of the transistor 421 is connected to the wiring 415. A drain terminal of the transistor 421 is connected to a wiring 411. A gate of the transistor 422 is connected to the wiring 405. One of a source terminal and a drain terminal of the transistor 422 is connected to the gate of the transistor 421. The other of the source terminal and the drain terminal of the transistor 422 is connected to a gate of the transistor 423. A source terminal of the transistor 423 is connected to the wiring 414. A drain terminal of the transistor 423 is connected to a wiring 412.

In the case where the transistors 402 to 404 are n-channel transistors, specifically, the potential VDD is applied to the wiring 405, the potential VSS is applied to the wiring 406, and the potential VEE is applied to the wiring 407. Potentials of a variety of signals such as clock signals are applied to the wirings 408 to 412 in addition to the potential Vin in the semiconductor device 100 illustrated in FIG. 1A. The potential GOUT and the potential SROUT are output from the wiring 414 and the wiring 415, respectively.

In the pulse generator 400 illustrated in FIG. 9B, the above structure can electrically isolate the gate and the source terminal of the output-side transistor 404 from each other. Thus, even when the transistor 404 is normally on and thus the potential of the wiring 407 for supplying a potential to the source terminal of the transistor 404 is raised, the transistor 404 can be turned off when it should be turned off.

Figure 10:
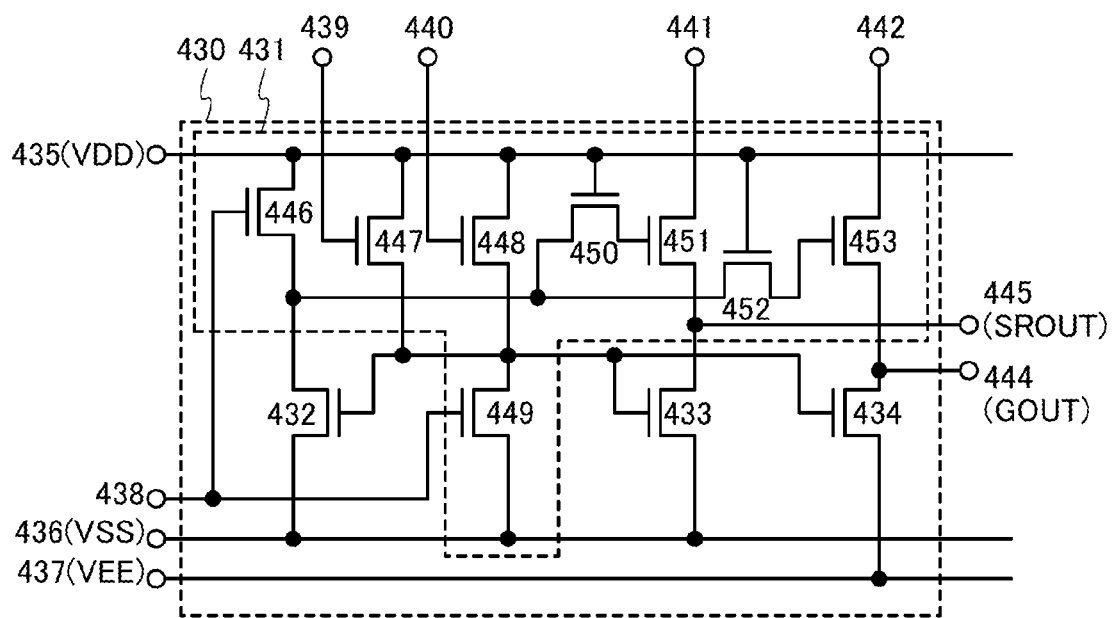
FIG. 10 illustrates the structure of a pulse generator.

A pulse generator 430 illustrated in FIG. 10 includes a circuit 431 and transistors 432 to 434. The circuit 431 corresponds to the circuit 101 illustrated in FIG. 1A. The transistors 432 and 433 each correspond to the transistor 102 illustrated in FIG. 1A. The transistor 434 corresponds to the transistor 103 illustrated in FIG. 1A.

A shift register can be constituted by connecting the plurality of pulse generators 430 to each other.

A gate of the transistor 432 is connected to gates of the transistors 433 and 434. A source terminal of the transistor 432 is connected to a wiring 436. A drain terminal of the transistor 432 is connected to the circuit 431. A source terminal of the transistor 433 is connected to the wiring 436. A drain terminal of the transistor 433 is connected to the circuit 431 and a wiring 445. A source terminal of the transistor 434 is connected to a wiring 437. A drain terminal of the transistor 434 is connected to the circuit 431 and a wiring 444.

The circuit 431 further includes transistors 446 to 453. Specifically, a gate of the transistor 446 is connected to a wiring 438. A source terminal of the transistor 446 is connected to the drain terminal of the transistor 432. A drain terminal of the transistor 446 is connected to a wiring 435. A gate of the transistor 447 is connected to a wiring 439. A source terminal of the transistor 447 is connected to the gates of the transistors 432 to 434. A drain terminal of the transistor 447 is connected to the wiring 435. A gate of the transistor 448 is connected to a wiring 440. A source terminal of the transistor 448 is connected to the gates of the transistors 432 to 434. A drain terminal of the transistor 448 is connected to the wiring 435. A gate of the transistor 449 is connected to the wiring 438. A source terminal of the transistor 449 is connected to the wiring 436. A drain terminal of the transistor 449 is connected to the gates of the transistors 432 to 434. A gate of the transistor 450 is connected to the wiring 435. One of a source terminal and a drain terminal of the transistor 450 is connected to the source terminal of the transistor 446 and the drain terminal of the transistor 432. The other of the source terminal and the drain terminal of the transistor 450 is connected to a gate of the transistor 451. A source terminal of the transistor 451 is connected to the wiring 445. A drain terminal of the transistor 451 is connected to a wiring 441. A gate of the transistor 452 is connected to the wiring 435. One of a source terminal and a drain terminal of the transistor 452 is connected to the source terminal of the transistor 446 and the drain terminal of the transistor 432. The other of the source terminal and the drain terminal of the transistor 452 is connected to a gate of the transistor 453. A source terminal of the transistor 453 is connected to the wiring 444. A drain terminal of the transistor 453 is connected to a wiring 442.

In the case where the transistors 432 to 434 are n-channel transistors, specifically, the potential VDD is applied to the wiring 435, the potential VSS is applied to the wiring 436, and the potential VEE is applied to the wiring 437. Potentials of a variety of signals such as clock signals are applied to the wirings 438 to 442 in addition to the potential Vin in the semiconductor device 100 illustrated in FIG. 1A. The potential GOUT and the potential SROUT are output from the wiring 444 and the wiring 445, respectively.

In the pulse generator 430 illustrated in FIG. 10, the above structure can electrically isolate the gate and the source terminal of the output-side transistor 434 from each other. Thus, even when the transistor 434 is normally on and thus the potential of the wiring 437 for supplying a potential to the source terminal of the transistor 434 is raised, the transistor 434 can be turned off when it should be turned off.

This embodiment can be combined with any of the other embodiments as appropriate.

Embodiment 3

A structure example of an inverter that is one of the semiconductor devices according to one embodiment of the present invention is described.

Figure 11:
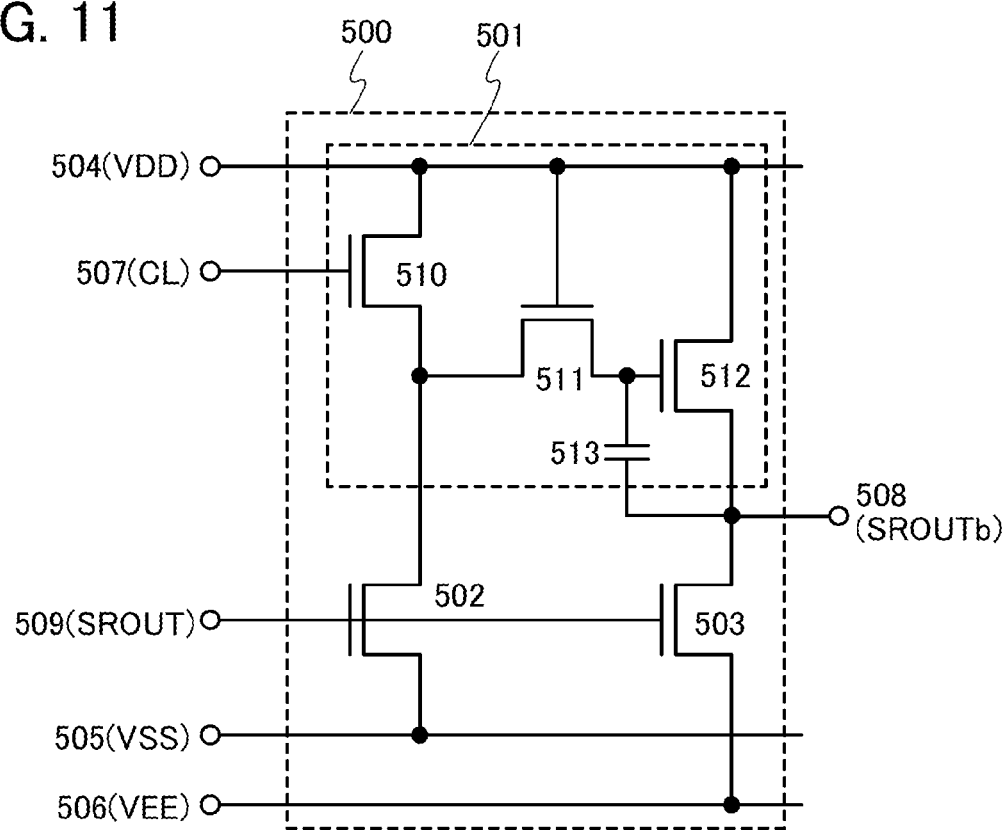
FIG. 11 illustrates the structure of an inverter.

FIG. 11 illustrates an example of an inverter according to one embodiment of the present invention. An inverter 500 illustrated in FIG. 11 includes a circuit 501 and transistors 502 and 503. The circuit 501 corresponds to the circuit 101 illustrated in FIG. 1A. The transistor 502 corresponds to the transistor 102 illustrated in FIG. 1A. The transistor 503 corresponds to the transistor 103 illustrated in FIG. 1A.

A gate of the transistor 502 is connected to a wiring 509. A source terminal of the transistor 502 is connected to a wiring 505. A drain terminal of the transistor 502 is connected to the circuit 501. A gate of the transistor 503 is connected to the wiring 509. A source terminal of the transistor 503 is connected to a wiring 506. A drain terminal of the transistor 503 is connected to the circuit 501 and a wiring 508.

The circuit 501 further includes transistors 510 to 512 and a capacitor 513. Specifically, a gate of the transistor 510 is connected to a wiring 507. A source terminal of the transistor 510 is connected to the drain terminal of the transistor 502. A drain terminal of the transistor 510 is connected to a wiring 504. A gate of the transistor 511 is connected to the wiring 504. One of a source terminal and a drain terminal of the transistor 511 is connected to the source terminal of the transistor 510 and the drain terminal of the transistor 502. The other of the source terminal and the drain terminal of the transistor 511 is connected to a gate of the transistor 512. A source terminal of the transistor 512 is connected to the drain terminal of the transistor 503 and the wiring 508. A drain terminal of the transistor 512 is connected to the wiring 504. One electrode of the capacitor 513 is connected to the gate of the transistor 512. The other electrode of the capacitor 513 is connected to the wiring 508.

In the case where the transistors 502 and 503 are n-channel transistors, specifically, the potential VDD is applied to the wiring 504, the potential VSS is applied to the wiring 505, and the potential VEE is applied to the wiring 506. The potential of a clock signal is applied to the wiring 507, and the potential Vin in the semiconductor device 100 illustrated in FIG. 1A is applied to the wiring 509. In FIG. 11, the potential Vin is the potential SROUT output from the wiring 214 in the pulse generator 200 illustrated in FIG. 2. A potential SROUTb that is obtained by inversion of the polarity of the potential SROUT is output from the wiring 508.

In the inverter 500 illustrated in FIG. 11, the above structure can electrically isolate the gate and the source terminal of the output-side transistor 503 from each other. Thus, even when the transistor 503 is normally on and thus the potential of the wiring 506 for supplying a potential to the source terminal of the transistor 503 is raised, the transistor 503 can be turned off when it should be turned off.

This embodiment can be combined with any of the other embodiments as appropriate.

Embodiment 4

Figure 12:
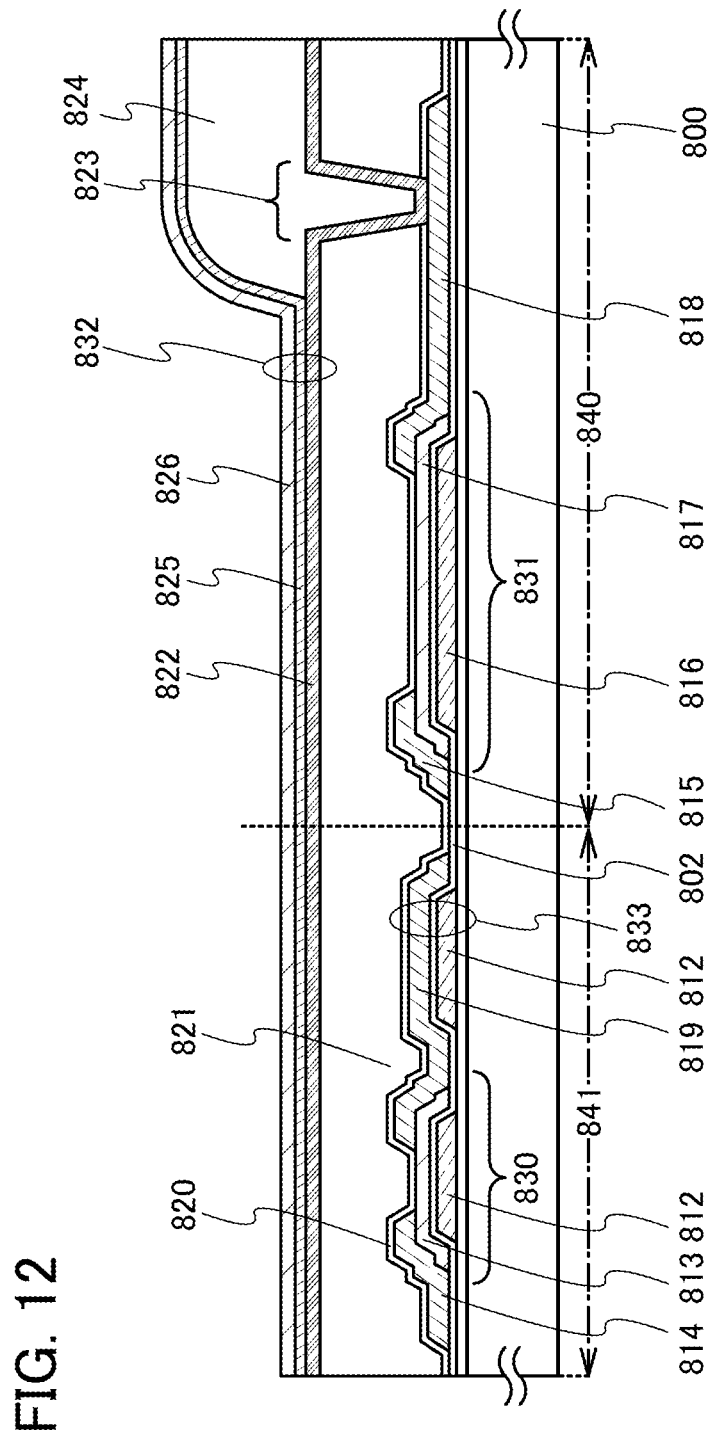
FIG. 12 is a cross-sectional view of a driver circuit and a pixel.

Cross-sectional structures of a pixel and a driver circuit in a semiconductor display device according to one embodiment of the present invention are described with reference to FIG. 12 by giving an EL display device as an example. FIG. 12 is an example of a cross-sectional view of a pixel 840 and a driver circuit 841.

In FIG. 12, the pixel 840 includes a light-emitting element 832 and a transistor 831 for controlling supply of current to the light-emitting element 832. The pixel 840 may include a variety of semiconductor elements such as a transistor for controlling input of an image signal to the pixel 840 and a capacitor for holding the potential of an image signal, in addition to the light-emitting element 832 and the transistor 831.

Further, in FIG. 12, the driver circuit 841 includes a transistor 830 and a capacitor 833 for holding the gate voltage of the transistor 830. Specifically, the transistor 830 corresponds to an output-side transistor included in a shift register that is part of the driver circuit 841. The driver circuit 841 may include a variety of semiconductor elements such as a transistor and a capacitor, in addition to the transistor 830 and the capacitor 833.

The transistor 831 includes, over a substrate 800 having an insulating surface, a conductive film 816 functioning as a gate, a gate insulating film 802 over the conductive film 816, a semiconductor film 817 positioned over the gate insulating film 802 to overlap with the conductive film 816, and conductive films 815 and 818 that are positioned over the semiconductor film 817 and function as a source terminal and a drain terminal. The conductive film 816 also functions as a scan line.

The transistor 830 includes, over the substrate 800 having an insulating surface, a conductive film 812 functioning as a gate, the gate insulating film 802 over the conductive film 812, a semiconductor film 813 positioned over the gate insulating film 802 to overlap with the conductive film 812, and conductive films 814 and 819 that are positioned over the semiconductor film 813 and function as a source terminal and a drain terminal.

The capacitor 833 includes, over the substrate 800 having an insulating surface, the conductive film 812, the gate insulating film 802 over the conductive film 812, and the conductive film 819 positioned over the gate insulating film 802 to overlap with the conductive film 812.

In addition, insulating films 820 and 821 are sequentially stacked over the conductive films 814, 815, 818, and 819. Further, a conductive film 822 functioning as an anode is formed over the insulating film 821. The conductive film 822 is connected to the conductive film 818 through a contact hole 823 that is formed in the insulating films 820 and 821.

In addition, an insulating film 824 having an opening where part of the conductive film 822 is exposed is provided over the insulating film 821. An EL layer 825 and a conductive film 826 functioning as a cathode are sequentially stacked over the part of the conductive film 822 and the insulating film 824. A region where the conductive film 822, the EL layer 825, and the conductive film 826 overlap with each other corresponds to the light-emitting element 832.

Note that in one embodiment of the present invention, the transistors 830 and 831 may each include a semiconductor film containing an amorphous, microcrystalline, polycrystalline, or single crystal semiconductor (e.g., silicon or germanium), or a semiconductor film containing a wide bandgap semiconductor (e.g., an oxide semiconductor).

When the semiconductor films of the transistors 830 and 831 each contain an amorphous, microcrystalline, polycrystalline, or single crystal semiconductor (e.g., silicon or germanium), impurity regions functioning as a source terminal and a drain terminal are formed by addition of an impurity element imparting one conductivity to the semiconductor films. For example, an impurity region having n-type conductivity can be formed by addition of phosphorus or arsenic to the semiconductor film. Further, for example, an impurity region having p-type conductivity can be formed by addition of boron to the semiconductor film.

In the case where an oxide semiconductor is used for the semiconductor films of the transistors 830 and 831, a dopant may be added to the semiconductor films to form impurity regions functioning as a source terminal and a drain terminal. The dopant can be added by ion implantation. A rare gas such as helium, argon, or xenon; a Group 15 atom such as nitrogen, phosphorus, arsenic, or antimony; or the like can be used as the dopant, for example. For example, in the case where nitrogen is used as the dopant, the concentration of nitrogen atoms in the impurity region is preferably $5\times10^{19}/cm^3$ or higher and $1\times10^{22}/cm^3$ or lower.

Note that as a silicon semiconductor, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Note that an oxide semiconductor preferably contains at least indium (In) or zinc (Zn). In particular, the oxide semiconductor preferably contains In and Zn. As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor. The oxide semiconductor may contain silicon.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when there is no electric field and off-state current can be sufficiently reduced. Further, with high mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

Note that a highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including the oxide semiconductor has extremely low off-state current. Further, the band gap of the oxide semiconductor is 2 eV or more, preferably 2.5 eV or more, more preferably 3 eV or more. With the use of an oxide semiconductor film that is highly purified by a sufficient decrease in concentration of impurities such as moisture or hydrogen and reduction of oxygen vacancies, the off-state current of the transistor can be decreased.

Specifically, various experiments can prove low off-state current of a transistor including a highly-purified oxide semiconductor for a semiconductor film. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between a source terminal and a drain terminal of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electrical charge flowing to or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it can be seen that, in the case where the voltage between the source terminal and the drain terminal of the transistor is 3 V, a lower off-state current of several tens of yoctoamperes per micrometer (yA/μm) is obtained. Accordingly, the transistor including the highly-purified oxide semiconductor film for a channel formation region has much lower off-state current than a crystalline silicon transistor.

Note that unless otherwise specified, in this specification, off-state current of an n-channel transistor is current that flows between a source terminal and a drain terminal when the potential of the drain terminal is higher than that of the source terminal or that of a gate while the potential of the gate is 0 V or lower in the case of the potential of the source terminal used as a reference. Alternatively, in this specification, off-state current of a p-channel transistor is current that flows between a source terminal and a drain terminal when the potential of the drain terminal is lower than that of the source terminal or that of a gate while the potential of the gate is 0 V or higher in the case of the potential of the source terminal used as a reference.

For example, the oxide semiconductor film can be formed by sputtering using a target including indium (In), gallium (Ga), and zinc (Zn). In the case where an In—Ga—Zn-based oxide semiconductor film is formed by sputtering, it is preferable to use a target of an In—Ga—Zn-based oxide with an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or a c-axis-aligned crystal (CAAC) OS to be described later is easily formed. The filling factor of the target including In, Ga, and Zn is higher than or equal to 90% and lower than or equal to 100%, preferably higher than or equal to 95% and lower than 100%. With the use of the target with a high filling factor, a dense oxide semiconductor film is formed.

In the case where an In—Zn-based material is used for the oxide semiconductor, a target used has an atomic ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=1.5:1 to 15:1 ($In_2O_3$:ZnO=3:4 to 15:2 in a molar ratio). For example, when a target used for deposition of an oxide semiconductor film formed using an In—Zn-based oxide has an atomic ratio of In:Zn:O=X:Y:Z, Z>1.5X+Y. The mobility can be increased by keeping the ratio of Zn within the above range.

Specifically, the oxide semiconductor film may be deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

Note that the oxide semiconductor film formed by sputtering or the like contains a large amount of moisture or hydrogen (including a hydroxyl group) as an impurity in some cases. Moisture and hydrogen easily form donor levels and thus serve as impurities in the oxide semiconductor. Thus, in one embodiment of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

Note that in some cases, the heat treatment makes oxygen released from the oxide semiconductor film and oxygen vacancies occur in the oxide semiconductor film. Thus, in one embodiment of the present invention, an insulating film containing oxygen is used as an insulating film that is in contact with the oxide semiconductor film, such as a gate insulating film. Then, heat treatment is performed after formation of the insulating film containing oxygen, so that oxygen is supplied from the insulating film to the oxide semiconductor film. With this structure, oxygen vacancies that serve as donors can be reduced and the stoichiometric proportion of the oxide semiconductor included in the oxide semiconductor film can be satisfied. It is preferable that the proportion of oxygen in the oxide semiconductor film be higher than the stoichiometric proportion. As a result, the oxide semiconductor film can be substantially intrinsic and variations in electrical characteristics of the transistor due to oxygen vacancies can be reduced, which results in an improvement of electrical characteristics.

Note that the heat treatment for supplying oxygen to the oxide semiconductor film is performed in an atmosphere of nitrogen, ultra dry air, or a rare gas (e.g., argon or helium) preferably at 200 to 400° C., for example, 250 to 350° C. It is preferable that the water content in the gas be 20 ppm or less, preferably 1 ppm or less, more preferably 10 ppb or less.

The oxide semiconductor may be either amorphous or crystalline. In the latter case, the oxide semiconductor may be either single crystalline or polycrystalline, may have a structure in which part of the oxide semiconductor is crystalline, may have an amorphous structure including a crystalline portion, or may be non-amorphous. As an example of the structure in which part of the oxide semiconductor is crystalline, an oxide including a crystal with c-axis alignment (also referred to as a c-axis aligned crystalline oxide semiconductor (CAAC-OS)) that has a triangular or hexagonal atomic order when seen from the direction perpendicular to the a-b plane, a surface, or an interface may be used. In the crystal, metal atoms are arranged in a layered manner, or metal atoms and oxygen atoms are arranged in a layered manner when seen from the direction perpendicular to the c-axis, and the direction of the a-axis or the b-axis is varied in the a-b plane (the crystal rotates around the c-axis).

In a broad sense, CAAC-OS means a non-single-crystal oxide including a phase that has a triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

CAAC-OS is not single crystal but this does not mean that CAAC-OS is composed of only an amorphous component.

Although CAAC-OS includes a crystalline portion, a boundary between one crystalline portion and another crystalline portion is not clear in some cases.

Nitrogen may be substituted for part of oxygen included in CAAC-OS. The c-axes of crystalline portions included in CAAC-OS may be aligned in a certain direction (e.g., a direction perpendicular to a surface of a substrate over which CAAC-OS is formed or a surface of CAAC-OS). Alternatively, the normals of the a-b planes of the crystalline portions included in CAAC-OS may be aligned in a certain direction (e.g., a direction perpendicular to a surface of a substrate over which CAAC-OS is formed or a surface of CAAC-OS).

CAAC-OS transmits or does not transmit visible light depending on its composition or the like.

As an example of such CAAC-OS, there is a crystal that is formed into a film shape and has a triangular or hexagonal atomic order when seen from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

Next, specific structure examples of transistors included in a semiconductor device according to the present invention are described.

Figure 13A:
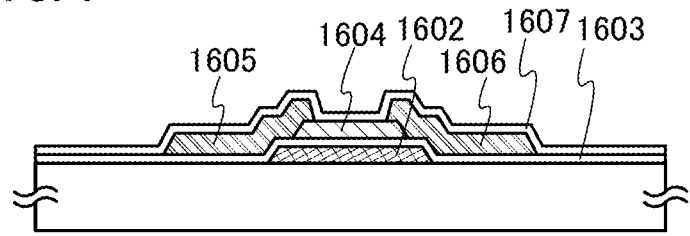
FIGS. 13A to 13D are cross-sectional views of transistors.

A transistor illustrated in FIG. 13A is a bottom-gate transistor with a channel-etched structure.

The transistor illustrated in FIG. 13A includes a gate electrode (gate) 1602 formed over an insulating surface, a gate insulating film 1603 over the gate electrode 1602, a semiconductor film 1604 over the gate insulating film 1603 that overlaps with the gate electrode 1602, and conductive films 1605 and 1606 formed over the semiconductor film 1604. The transistor may further include an insulating film 1607 formed over the semiconductor film 1604 and the conductive films 1605 and 1606.

Note that the transistor illustrated in FIG. 13A may further include a back-gate electrode formed over the insulating film 1607 in a portion that overlaps with the semiconductor film 1604.

Figure 13B:
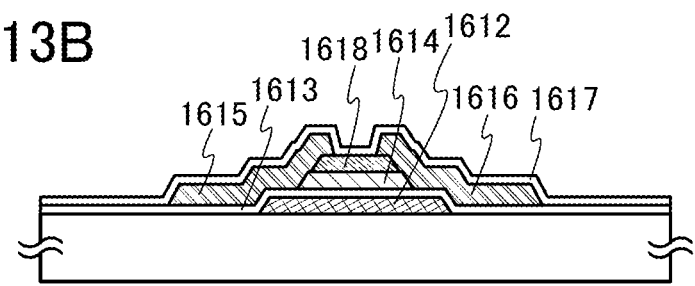

A transistor illustrated in FIG. 13B is a bottom-gate transistor with a channel-protective structure.

The transistor illustrated in FIG. 13B includes a gate electrode 1612 formed over an insulating surface, a gate insulating film 1613 over the gate electrode 1612, a semiconductor film 1614 over the gate insulating film 1613 that overlaps with the gate electrode 1612, a channel protective film 1618 formed over the semiconductor film 1614, and conductive films 1615 and 1616 formed over the semiconductor film 1614. The transistor may further include an insulating film 1617 formed over the channel protective film 1618 and the conductive films 1615 and 1616.

Note that the transistor illustrated in FIG. 13B may further include a back-gate electrode formed over the insulating film 1617 in a portion that overlaps with the semiconductor film 1614.

The channel protective film 1618 can prevent a portion of the semiconductor film 1614 that serves as a channel formation region from being damaged in a later step, for example, a reduction in thickness due to plasma or an etchant during etching. Thus, the reliability of the transistor can be improved.

Figure 13C:
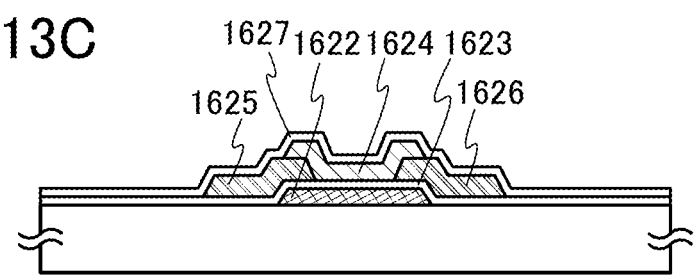

A transistor illustrated in FIG. 13C is a bottom-gate transistor with a bottom-contact structure.

The transistor illustrated in FIG. 13C includes a gate electrode 1622 over an insulating surface, a gate insulating film 1623 over the gate electrode 1622, conductive films 1625 and 1626 over the gate insulating film 1623, and a semiconductor film 1624 over the gate insulating film 1623 that overlaps with the gate electrode 1622 and is formed over the conductive films 1625 and 1626. Further, the transistor may include an insulating film 1627 formed over the conductive films 1625 and 1626 and the semiconductor film 1624.

Note that the transistor illustrated in FIG. 13C may further include a back-gate electrode formed over the insulating film 1627 in a portion that overlaps with the semiconductor film 1624.

Figure 13D:
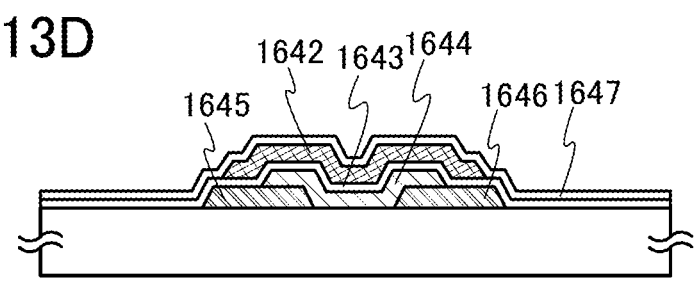

A transistor illustrated in FIG. 13D is a top-gate transistor with a bottom-contact structure.

The transistor illustrated in FIG. 13D includes conductive films 1645 and 1646 over an insulating surface, a semiconductor film 1644 over the conductive films 1645 and 1646, a gate insulating film 1643 formed over the semiconductor film 1644, and a gate electrode 1642 over the gate insulating film 1643 that overlaps with the semiconductor film 1644. Further, the transistor may include an insulating film 1647 formed over the gate electrode 1642.

This embodiment can be combined with any of the other embodiments as appropriate.

Embodiment 5

FIG. 14 illustrates an example of a panel that corresponds to one embodiment of a semiconductor display device. The panel illustrated in FIG. 14 includes a substrate 700, and a pixel portion 701, a signal line driver circuit 702, a scan line driver circuit 703, and a terminal 704 that are over the substrate 700.

The pixel portion 701 includes a plurality of pixels. Each pixel includes a display element and one or more transistors for controlling the operation of the display element. The scan line driver circuit 703 selects a pixel in the pixel portion 701 by controlling supply of potentials to scan lines connected to the pixels. The signal line driver circuit 702 controls supply of an image signal to the pixel selected by the scan line driver circuit 703.

In the panel illustrated in FIG. 14, a shift register according to one embodiment of the present invention is used as the scan line driver circuit 703. In FIG. 14, the potential VEE, the potential VSS, and the potential VDD are applied to the scan line driver circuit 703 through the terminal 704.

Since the scan line is connected to the plurality of pixels, high current supply capability is needed. When a potential is supplied to the scan line with the use of the shift register according to one embodiment of the present invention, a decrease in amplitude of a potential supplied to the scan line can be prevented. Thus, a display defect in the pixel portion 701 due to small amplitude of a signal supplied to the scan line is reduced, so that a high-quality image can be displayed.

Note that in this embodiment, the shift register according to one embodiment of the present invention is used as the scan line driver circuit 703; however, the shift register according to one embodiment of the present invention may be used as the signal line driver circuit 702.

This embodiment can be combined with any of the other embodiments as appropriate.

Embodiment 6

A semiconductor device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor device according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 15A to 15E illustrate specific examples of these electronic devices.

Figure 15A:
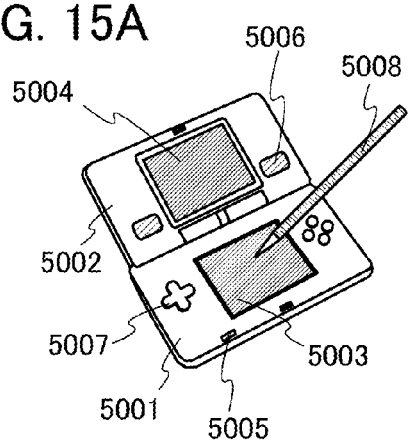
FIGS. 15A to 15E illustrate electronic devices.

FIG. 15A illustrates a portable game machine, which includes a housing 5001, a housing 5002, a display portion 5003, a display portion 5004, a microphone 5005, a speaker 5006, an operation key 5007, a stylus 5008, and the like. With the use of the semiconductor device according to one embodiment of the present invention as a driver circuit of the portable game machine, it is possible to provide a low-power portable game machine whose operation is stable. It is possible to provide a high-definition portable game machine with the use of the semiconductor device according to one embodiment of the present invention as the display portion 5003 or 5004. Note that although the portable game machine illustrated in FIG. 15A has the two display portions 5003 and 5004, the number of display portions included in the portable game machine is not limited thereto.

Figure 15B:
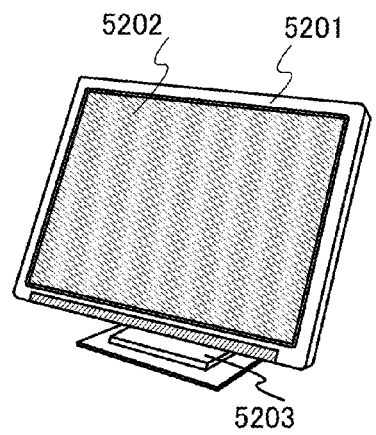

FIG. 15B illustrates a display device, which includes a housing 5201, a display portion 5202, a support 5203, and the like. With the use of the semiconductor device according to one embodiment of the present invention as a driver circuit of the display device, it is possible to provide a low-power display device whose operation is stable. It is possible to provide a high-definition display device with the use of the semiconductor display device according to one embodiment of the present invention as the display portion 5202. Note that the display device means all display devices for displaying information, such as display devices for personal computers, for receiving TV broadcast, and for displaying advertisements.

Figure 15C:
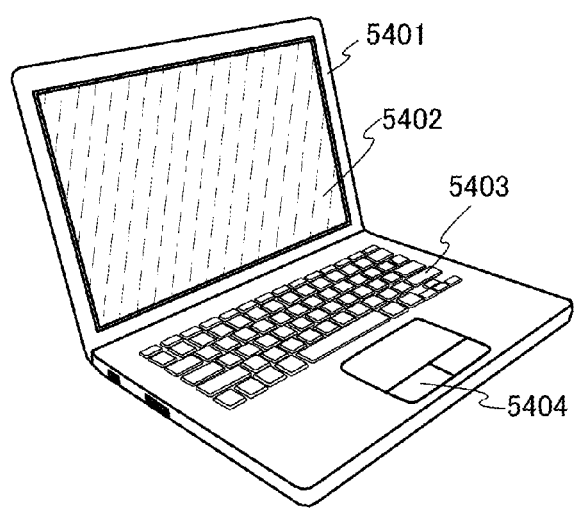

FIG. 15C illustrates a laptop, which includes a housing 5401, a display portion 5402, a keyboard 5403, a pointing device 5404, and the like. With the use of the semiconductor device according to one embodiment of the present invention as a driver circuit of the laptop, it is possible to provide a low-power laptop whose operation is stable. It is possible to provide a high-definition laptop with the use of the semiconductor display device according to one embodiment of the present invention as the display portion 5402.

Figure 15D:
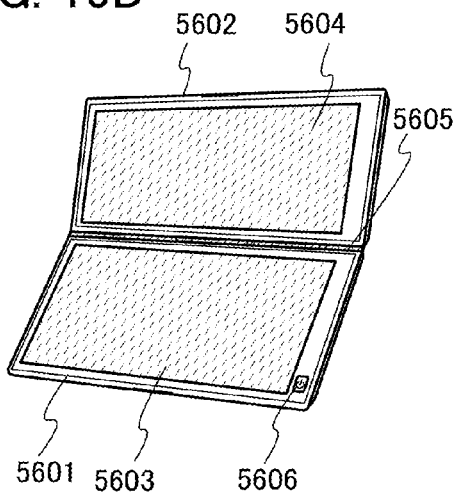

FIG. 15D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A semiconductor display device with a position input function may be used as at least one of the first display portion 5603 and the second display portion 5604. Note that the position input function can be added by provision of a touch panel in a semiconductor display device. Alternatively, the position input function can be added by provision of a photoelectric conversion element called a photosensor in a pixel portion of a semiconductor display device. With the use of the semiconductor device according to one embodiment of the present invention as a driver circuit of the personal digital assistant, it is possible to provide a low-power personal digital assistant whose operation is stable. It is possible to provide a high-definition personal digital assistant with the use of the semiconductor display device according to one embodiment of the present invention as the first display portion 5603 or the second display portion 5604.

Figure 15E:
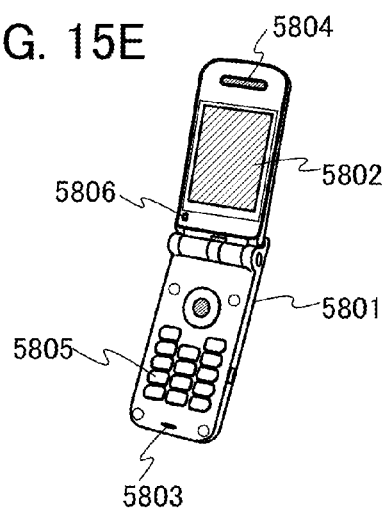

FIG. 15E illustrates a cellular phone, which includes a housing 5801, a display portion 5802, an audio input portion 5803, an audio output portion 5804, operation keys 5805, a light receiving portion 5806, and the like. Light received in the light receiving portion 5806 is converted into electrical signals, so that external images can be loaded. With the use of the semiconductor device according to one embodiment of the present invention as a driver circuit of the cellular phone, it is possible to provide a low-power cellular phone whose operation is stable. It is possible to provide a high-definition cellular phone with the use of the semiconductor display device according to one embodiment of the present invention as the display portion 5802.

This embodiment can be combined with any of the other embodiments as appropriate.

REFERENCE NUMERALS

100: semiconductor device, 101: circuit, 102: transistor, 103: transistor, 104: wiring, 105: wiring, 106: wiring, 107: wiring, 108: wiring, 109: transistor, 110: capacitor, 200: pulse generator, 200_1 to 200_y: pulse generator, 201: circuit, 202: transistor, 203: transistor, 204: transistor, 205: wiring, 206: wiring, 207: wiring, 208: wiring, 209: wiring, 210: wiring, 211: wiring, 212: wiring, 213: wiring, 214: wiring, 215: transistor, 216: transistor, 217: transistor, 218: transistor, 219: transistor, 220: transistor, 221: transistor, 222: transistor, 223: transistor, 224: capacitor, 225: capacitor, 230: resistor, 231: resistor, 232: solid line, 233: solid line, 300: pulse generator, 301: circuit, 302: transistor, 303: transistor, 304: transistor, 305: wiring, 306: wiring, 307: wiring, 308: wiring, 309: wiring, 310: wiring, 311: wiring, 312: wiring, 313: wiring, 314: wiring, 315: transistor, 316: transistor, 317: transistor, 318: transistor, 319: transistor, 320: transistor, 330: pulse generator, 331: circuit, 332: transistor, 333: transistor, 334: transistor, 335: wiring, 336: wiring, 337: wiring, 338: wiring, 339: wiring, 340: wiring, 341: wiring, 342: wiring, 343: wiring, 344: wiring, 345: wiring, 346: transistor, 347: transistor, 348: transistor, 349: transistor, 350: transistor, 351: transistor, 352: transistor, 360: pulse generator, 361: circuit, 362: transistor, 363: transistor, 364: transistor, 365: wiring, 366: wiring, 367: wiring, 368: wiring, 369: wiring, 370: wiring, 371: wiring, 372: wiring, 374: wiring, 375: wiring, 376: transistor, 377: transistor, 378: transistor, 379: transistor, 380: transistor, 381: transistor, 382: transistor, 400: pulse generator, 401: circuit, 402: transistor, 403: transistor, 404: transistor, 405: wiring, 406: wiring, 407: wiring, 408: wiring, 409: wiring, 410: wiring, 411: wiring, 412: wiring, 414: wiring, 415: wiring, 416: transistor, 417: transistor, 418: transistor, 419: transistor, 420: transistor, 421: transistor, 422: transistor, 423: transistor, 430: pulse generator, 431: circuit, 432: transistor, 433: transistor, 434: transistor, 435: wiring, 436: wiring, 437: wiring, 438: wiring, 439: wiring, 440: wiring, 441: wiring, 442: wiring, 444: wiring, 445: wiring, 446: transistor, 447: transistor, 448: transistor, 449: transistor, 450: transistor, 451: transistor, 452: transistor, 453: transistor, 500: inverter, 501: circuit, 502: transistor, 503: transistor, 504: wiring, 505: wiring, 506: wiring, 507: wiring, 508: wiring, 509: wiring, 510: transistor, 511: transistor, 512: transistor, 513: capacitor, 700: substrate, 701: pixel portion, 702: signal line driver circuit, 703: scan line driver circuit, 704: terminal, 800: substrate, 802: gate insulating film, 812: conductive film, 813: semiconductor film, 814: conductive film, 815: conductive film, 816: conductive film, 817: semiconductor film, 818: conductive film, 819: conductive film, 820: insulating film, 821: insulating film, 822: conductive film, 823: contact hole, 824: insulating film, 825: EL layer, 826: conductive film, 830: transistor, 831: transistor, 832: light-emitting element, 833: capacitor, 840: pixel, 841: driver circuit, 1602: gate electrode, 1603: gate insulating film, 1604: semiconductor film, 1605: conductive film, 1606: conductive film, 1607: insulating film, 1612: gate electrode, 1613: gate insulating film, 1614: semiconductor film, 1615: conductive film, 1616: conductive film, 1617: insulating film, 1618: channel protective film, 1622: gate electrode, 1623: gate insulating film, 1624: semiconductor film, 1625: conductive film, 1626: conductive film, 1627: insulating film, 1642: gate electrode, 1643: gate insulating film, 1644: semiconductor film, 1645: conductive film, 1646: conductive film, 1647: insulating film, 5001: housing, 5002: housing, 5003: display portion, 5004: display portion, 5005: microphone, 5006: speaker, 5007: operation key, 5008: stylus, 5201: housing, 5202: display portion, 5203: support, 5401: housing, 5402: display portion, 5403: keyboard, 5404: pointing device, 5601: first housing, 5602: second housing, 5603: first display portion, 5604: second display portion, 5605: joint, 5606: operation key, 5801: housing, 5802: display portion, 5803: audio input portion, 5804: audio output portion, 5805: operation key, and 5806: light receiving portion.

This application is based on Japanese Patent Application serial No. 2011-185614 filed with Japan Patent Office on Aug. 29, 2011, the entire contents of which are hereby incorporated by reference.

The invention claimed is:

1. A semiconductor device comprising:
    a first wiring configured to be supplied with a first potential;
    a second wiring configured to be supplied with a second potential that is different from the first potential;
    a third wiring configured to be supplied with a third potential higher than the first potential and the second potential;
    a fourth wiring configured to be supplied with a first clock signal;
    a first transistor comprising a first terminal, a second terminal, and a gate;
    a second transistor comprising a first terminal, a second terminal, and a gate;
    a third transistor comprising a first terminal, a second terminal, and a gate;
    a fourth transistor comprising a first terminal, a second terminal, and a gate;
    a fifth transistor comprising a first terminal, a second terminal, and a gate;
    a sixth transistor comprising a first terminal, a second terminal, and a gate; and
    a seventh transistor comprising a first terminal, a second terminal, and a gate,
    wherein the gate of the first transistor is electrically connected to the gate of the third transistor,
    wherein the second terminal of the first transistor is electrically connected to the first terminal of the second transistor,
    wherein the gate of the second transistor is electrically connected to the gate of the fourth transistor,
    wherein the second terminal of the second transistor is electrically connected to the first wiring,
    wherein the second terminal of the third transistor is electrically connected to the first terminal of the fourth transistor, and
    wherein the second terminal of the fourth transistor is electrically connected to the second wiring,
    wherein the first terminal of the fifth transistor is electrically connected to the gate of the second transistor and the gate of the fourth transistor,
    wherein the second terminal of the fifth transistor is electrically connected to the second wiring,
    wherein the first terminal of the sixth transistor is electrically connected to the third wiring,
    wherein the second terminal of the sixth transistor is electrically connected to the gate of the second transistor and the gate of the fourth transistor,
    wherein the first terminal of the seventh transistor is electrically connected to the third wiring,
    wherein the second terminal of the seventh transistor is electrically connected to the first terminal of the fifth transistor, and
    wherein the fourth wiring is electrically connected to the first terminal of the first transistor and the first terminal of the third transistor.

2. The semiconductor device according to claim 1, further comprising a fifth wiring electrically connected to the gate of the sixth transistor, wherein the fifth wiring is configured to be supplied with a second clock signal.

3. The semiconductor device according to claim 1, wherein the first transistor, the second transistor, the third transistor, and the fourth transistor have the same polarity as one another.

4. The semiconductor device according to claim 1, wherein a channel width of the second transistor is larger than a channel width of the fourth transistor.

5. The semiconductor device according to claim 1, wherein the first potential is higher than the second potential.

6. The semiconductor device according to claim 1, wherein the first wiring is electrically isolated from the second wiring.

7. The semiconductor device according to claim 1, further comprising a eighth transistor comprising a first terminal, a second terminal, and a gate,
    wherein the first terminal of the eighth transistor is electrically connected to the gate of the first transistor and the gate of the third transistor,
    wherein the second terminal of the eighth transistor is electrically connected to the second wiring, and
    wherein the gate of the eighth transistor is electrically connected to the gate of the second transistor and the gate of the fourth transistor.

8. The semiconductor device according to claim 1, further comprising a capacitor comprising a first terminal and a second terminal,
    wherein the first terminal of the capacitor is electrically connected to the gate of the first transistor and the gate of the third transistor, and
    wherein the second terminal of the capacitor is electrically connected to the second terminal of the first transistor and the first terminal of the second transistor.

9. The semiconductor device according to claim 1, further comprising a capacitor comprising a first terminal and a second terminal,
   wherein the first terminal of the capacitor is electrically connected to the gate of the first transistor and the gate of the third transistor, and
   wherein the second terminal of the capacitor is electrically connected to the second terminal of the third transistor and the first terminal of the fourth transistor.

10. A display device comprising:
   a pixel portion; and
   a scan line driver circuit electrically connected to the pixel portion,
   wherein the scan line driver circuit comprises the semiconductor device according to claim 1.

11. A semiconductor device comprising:
   a pulse generator comprising:
   a first wiring configured to be supplied with a first potential;
   a second wiring configured to be supplied with a second potential that is different from the first potential;
   a third wiring configured to be supplied with a third potential higher than the first potential and the second potential;
   a fourth wiring configured to be supplied with a first clock signal;
   a first transistor comprising a first terminal, a second terminal, and a gate;
   a second transistor comprising a first terminal, a second terminal, and a gate;
   a third transistor comprising a first terminal, a second terminal, and a gate;
   a fourth transistor comprising a first terminal, a second terminal, and a gate;
   a fifth transistor comprising a first terminal, a second terminal, and a gate;
   a sixth transistor comprising a first terminal, a second terminal, and a gate; and
   a seventh transistor comprising a first terminal, a second terminal, and a gate,
   wherein the gate of the first transistor is electrically connected to the gate of the third transistor,
   wherein the second terminal of the first transistor is electrically connected to the first terminal of the second transistor,
   wherein the gate of the second transistor is electrically connected to the gate of the fourth transistor,
   wherein the second terminal of the second transistor is electrically connected to the first wiring,
   wherein the second terminal of the third transistor is electrically connected to the first terminal of the fourth transistor, and
   wherein the second terminal of the fourth transistor is electrically connected to the second wiring,
   wherein the first terminal of the fifth transistor is electrically connected to the gate of the second transistor and the gate of the fourth transistor,
   wherein the second terminal of the fifth transistor is electrically connected to the second wiring,
   wherein the first terminal of the sixth transistor is electrically connected to the third wiring,
   wherein the second terminal of the sixth transistor is electrically connected to the gate of the second transistor and the gate of the fourth transistor,
   wherein the first terminal of the seventh transistor is electrically connected to the third wiring,
   wherein the second terminal of the seventh transistor is electrically connected to the first terminal of the fifth transistor, and
   wherein the fourth wiring is electrically connected to the first terminal of the first transistor and the first terminal of the third transistor.

12. The semiconductor device according to claim 11, wherein the first transistor, the second transistor, the third transistor, and the fourth transistor have the same polarity as one another.

13. The semiconductor device according to claim 11, wherein a channel width of the second transistor is larger than a channel width of the fourth transistor.

14. The semiconductor device according to claim 11, wherein the first potential is higher than the second potential.

15. The semiconductor device according to claim 11, wherein the first wiring is electrically isolated from the second wiring.

16. The semiconductor device according to claim 11, further comprising a eighth transistor comprising a first terminal, a second terminal, and a gate,
   wherein the first terminal of the eighth transistor is electrically connected to the gate of the first transistor and the gate of the third transistor,
   wherein the second terminal of the eighth transistor is electrically connected to the second wiring, and
   wherein the gate of the eighth transistor is electrically connected to the gate of the second transistor and the gate of the fourth transistor.

17. The semiconductor device according to claim 11, further comprising a capacitor comprising a first terminal and a second terminal,
   wherein the first terminal of the capacitor is electrically connected to the gate of the first transistor and the gate of the third transistor, and
   wherein the second terminal of the capacitor is electrically connected to the second terminal of the first transistor and the first terminal of the second transistor.

18. The semiconductor device according to claim 11, further comprising a capacitor comprising a first terminal and a second terminal,
   wherein the first terminal of the capacitor is electrically connected to the gate of the first transistor and the gate of the third transistor, and
   wherein the second terminal of the capacitor is electrically connected to the second terminal of the third transistor and the first terminal of the fourth transistor.

19. A display device comprising:
   a pixel portion; and
   a scan line driver circuit electrically connected to the pixel portion,
   wherein the scan line driver circuit comprises the semiconductor device according to claim 11.

20. A semiconductor device comprising:
   a shift register comprising a plurality of pulse generators including a first pulse generator and a second pulse generator, the first pulse generator comprising:
   a first wiring configured to be supplied with a first potential;
   a second wiring configured to be supplied with a second potential;
   a third wiring configured to be supplied with a third potential higher than the first potential and the second potential;
   a fourth wiring configured to be supplied with a first clock signal;

a first transistor comprising a first terminal, a second terminal, and a gate;
a second transistor comprising a first terminal, a second terminal, and a gate;
a third transistor comprising a first terminal, a second terminal, and a gate;
a fourth transistor comprising a first terminal, a second terminal, and a gate;
a fifth transistor comprising a first terminal, a second terminal, and a gate;
a sixth transistor comprising a first terminal, a second terminal, and a gate; and
a seventh transistor comprising a first terminal, a second terminal, and a gate,
wherein the gate of the first transistor is electrically connected to the gate of the third transistor,
wherein the second terminal of the first transistor is electrically connected to the first terminal of the second transistor,
wherein the gate of the second transistor is electrically connected to the gate of the fourth transistor,
wherein the second terminal of the second transistor is electrically connected to the first wiring,
wherein the second terminal of the third transistor is electrically connected to the first terminal of the fourth transistor,
wherein the second terminal of the fourth transistor is electrically connected to the second wiring,
wherein the first terminal of the fifth transistor is electrically connected to the gate of the second transistor and the gate of the fourth transistor,
wherein the second terminal of the fifth transistor is electrically connected to the second wiring,
wherein the second terminal of the third transistor and the first terminal of the fourth transistor are electrically connected to the second pulse generator,
wherein the first terminal of the sixth transistor is electrically connected to the third wiring,
wherein the second terminal of the sixth transistor is electrically connected to the gate of the second transistor and the gate of the fourth transistor,
wherein the first terminal of the seventh transistor is electrically connected to the third wiring,
wherein the second terminal of the seventh transistor is electrically connected to the first terminal of the fifth transistor, and
wherein the fourth wiring is electrically connected to the first terminal of the first transistor and the first terminal of the third transistor.

21. The semiconductor device according to claim 20, wherein the first potential is higher than the second potential.

22. The semiconductor device according to claim 20, wherein a channel width of the second transistor is larger than a channel width of the fourth transistor.

23. The semiconductor device according to claim 20, wherein the first wiring is electrically isolated from the second wiring.

24. The semiconductor device according to claim 20, further comprising a eighth transistor comprising a first terminal, a second terminal, and a gate,
wherein the first terminal of the eighth transistor is electrically connected to the gate of the first transistor and the gate of the third transistor,
wherein the second terminal of the eighth transistor is electrically connected to the second wiring, and
wherein the gate of the eighth transistor is electrically connected to the gate of the second transistor and the gate of the fourth transistor.

25. The semiconductor device according to claim 20, further comprising a capacitor comprising a first terminal and a second terminal,
wherein the first terminal of the capacitor is electrically connected to the gate of the first transistor and the gate of the third transistor, and
wherein the second terminal of the capacitor is electrically connected to the second terminal of the first transistor and the first terminal of the second transistor.

26. The semiconductor device according to claim 20, further comprising a capacitor comprising a first terminal and a second terminal,
wherein the first terminal of the capacitor is electrically connected to the gate of the first transistor and the gate of the third transistor, and
wherein the second terminal of the capacitor is electrically connected to the second terminal of the third transistor and the first terminal of the fourth transistor.

27. A display device comprising:
a pixel portion; and
a scan line driver circuit electrically connected to the pixel portion,
wherein the scan line driver circuit comprises the semiconductor device according to claim 20.

* * * * *